US010741399B2

(12) United States Patent
Mazur et al.

(10) Patent No.: US 10,741,399 B2
(45) Date of Patent: *Aug. 11, 2020

(54) FEMTOSECOND LASER-INDUCED FORMATION OF SUBMICROMETER SPIKES ON A SEMICONDUCTOR SUBSTRATE

(71) Applicant: President & Fellows of Harvard College, Cambridge, MA (US)

(72) Inventors: Eric Mazur, Concord, MA (US); Mengyan Shen, Belmont, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,940

(22) Filed: Feb. 14, 2018

(65) Prior Publication Data
US 2018/0182630 A1    Jun. 28, 2018

Related U.S. Application Data

(60) Continuation of application No. 14/836,609, filed on Aug. 26, 2015, now Pat. No. 10,361,083, which is a
(Continued)

(51) Int. Cl.
*H01L 21/268* (2006.01)
*B23K 26/12* (2014.01)
(Continued)

(52) U.S. Cl.
CPC ........ *H01L 21/268* (2013.01); *B23K 26/1224* (2015.10); *H01L 21/0259* (2013.01);
(Continued)

(58) Field of Classification Search
CPC ..... H01L 29/30; H01L 21/0259; H01L 29/34; H01L 21/268; H01L 21/302;
(Continued)

(56) References Cited

U.S. PATENT DOCUMENTS 3,487,223 A   12/1969  St. John
3,922,571 A   11/1975  Smith
(Continued)

FOREIGN PATENT DOCUMENTS

AU   3666484 A   6/1985
CN   1507075 A   6/2004
(Continued)

OTHER PUBLICATIONS

Shen et al., "Formation of Regular Arrays of Silicon Microspikes by Femtosecond Laser Irradiation Through a Mask", Appl. Phys. Lett., 82, 1715-1717 (Mar. 1, 2003).
(Continued)

Primary Examiner — Ismail A Muse
(74) Attorney, Agent, or Firm — Nelson Mullins Riley & Scarborough LLP

(57) ABSTRACT

The present invention generally provides semiconductor substrates having submicron-sized surface features generated by irradiating the surface with ultra short laser pulses. In one aspect a method of processing a semiconductor substrate is disclosed that includes placing at least a portion of a surface of the substrate in contact with a fluid, and exposing that surface portion to one or more femtosecond pulses so as to modify the topography of that portion. The modification can include, e.g., generating a plurality of submicron-sized spikes in an upper layer of the surface.

18 Claims, 7 Drawing Sheets

Related U.S. Application Data continuation of application No. 14/073,460, filed on Nov. 6, 2013, now Pat. No. 9,136,146, which is a continuation of application No. 13/021,409, filed on Feb. 4, 2011, now Pat. No. 8,598,051, which is a continuation of application No. 12/235,086, filed on Sep. 22, 2008, now Pat. No. 7,884,446, which is a division of application No. 11/196,929, filed on Aug. 4, 2005, now Pat. No. 7,442,629, which is a continuation-in-part of application No. 10/950,248, filed on Sep. 24, 2004, now Pat. No. 7,354,792, and a continuation-in-part of application No. 10/950,230, filed on Sep. 24, 2004, now Pat. No. 7,057,256.

(51) Int. Cl.
  *H01L 21/02* (2006.01)
  *H01L 29/34* (2006.01)
  *H01L 29/30* (2006.01)
  *H01L 21/67* (2006.01)
  *H01L 21/225* (2006.01)
  *H01L 21/302* (2006.01)

(52) U.S. Cl.
  CPC .. *H01L 21/02381* (2013.01); *H01L 21/02532* (2013.01); *H01L 21/02686* (2013.01); *H01L 21/2252* (2013.01); *H01L 21/302* (2013.01); *H01L 21/67075* (2013.01); *H01L 29/30* (2013.01); *H01L 29/34* (2013.01); *Y10S 438/94* (2013.01)

(58) Field of Classification Search
  CPC ........... H01L 21/2252; H01L 21/02381; H01L 21/02686; H01L 21/02532; H01L 21/67075; B23K 26/1224; Y10S 438/94
  See application file for complete search history.

(56) References Cited

U.S. PATENT DOCUMENTS

| | | |
|---|---|---|
| 3,973,994 A | 8/1976 | Redfield |
| 3,994,012 A | 11/1976 | Warner, Jr. |
| 4,017,887 A | 4/1977 | Davies et al. |
| 4,105,955 A | 8/1978 | Hayashi |
| 4,149,174 A | 4/1979 | Shannon |
| 4,176,365 A | 11/1979 | Kroger |
| 4,181,538 A | 1/1980 | Narayan et al. |
| 4,201,450 A | 5/1980 | Trapani |
| 4,242,149 A | 12/1980 | King et al. |
| 4,253,882 A | 3/1981 | Dalal |
| 4,277,793 A | 7/1981 | Web et al. |
| 4,322,571 A | 3/1982 | Stanbery |
| 4,343,832 A | 8/1982 | Smith |
| 4,346,164 A | 8/1982 | Tabarelli et al. |
| 4,419,533 A | 12/1983 | Czubatyj et al. |
| 4,452,826 A | 6/1984 | Shields et al. |
| 4,493,942 A | 1/1985 | Sheng et al. |
| 4,514,582 A | 4/1985 | Tiedje et al. |
| 4,536,608 A | 8/1985 | Sheng et al. |
| 4,546,945 A | 10/1985 | Nessfield |
| 4,568,960 A | 2/1986 | Petroff et al. |
| 4,593,303 A | 6/1986 | Dyck et al. |
| 4,593,313 A | 6/1986 | Nagasaki et al. |
| 4,617,593 A | 10/1986 | Dudley |
| 4,630,082 A | 12/1986 | Sakai |
| 4,648,936 A | 3/1987 | Ashby et al. |
| 4,663,188 A | 5/1987 | Kane |
| 4,672,206 A | 6/1987 | Suzuki et al. |
| 4,673,770 A | 6/1987 | Mandelkorn |
| 4,679,068 A | 7/1987 | Lillquist et al. |
| 4,703,996 A | 11/1987 | Glass et al. |
| 4,723,086 A | 2/1988 | Leibovich et al. |
| 4,751,571 A | 6/1988 | Lillquist |
| 4,773,944 A | 9/1988 | Nath et al. |
| 4,775,425 A | 10/1988 | Guha et al. |
| 4,777,490 A | 10/1988 | Sharma et al. |
| 4,829,013 A | 5/1989 | Yamazaki |
| 4,838,952 A | 6/1989 | Dill et al. |
| 4,883,962 A | 11/1989 | Elliott |
| 4,886,958 A | 12/1989 | Merryman et al. |
| 4,887,255 A | 12/1989 | Handa |
| 4,894,526 A | 1/1990 | Bethea et al. |
| 4,910,568 A | 3/1990 | Takei et al. |
| 4,910,588 A | 3/1990 | Kinoshita et al. |
| 4,964,134 A | 10/1990 | Westbrook et al. |
| 4,965,784 A | 10/1990 | Land et al. |
| 4,968,372 A | 11/1990 | Maass |
| 4,999,308 A | 3/1991 | Nishiura et al. |
| 5,021,100 A | 6/1991 | Ishihara et al. |
| 5,021,854 A | 6/1991 | Huth |
| 5,080,725 A | 1/1992 | Green et al. |
| 5,081,049 A | 1/1992 | Green et al. |
| 5,089,437 A | 2/1992 | Shima |
| 5,100,478 A | 3/1992 | Kawabata |
| 5,101,260 A | 3/1992 | Nath et al. |
| 5,114,876 A | 5/1992 | Weiner |
| 5,127,964 A | 7/1992 | Hamakawa et al. |
| 5,164,324 A | 11/1992 | Russell et al. |
| 5,182,231 A | 1/1993 | Hongo et al. |
| 5,208,822 A | 5/1993 | Haus et al. |
| 5,223,043 A | 6/1993 | Olson et al. |
| 5,234,790 A | 8/1993 | Lang et al. |
| 5,236,863 A | 8/1993 | Iranmanesh |
| 5,244,817 A | 9/1993 | Hawkins et al. |
| 5,296,045 A | 3/1994 | Banerjee et al. |
| 5,309,275 A | 5/1994 | Nishimura et al. |
| 5,322,988 A | 6/1994 | Russell et al. |
| 5,346,850 A | 9/1994 | Kaschmitter et al. |
| 5,351,446 A | 10/1994 | Langsdorf |
| 5,370,747 A | 12/1994 | Noguchi et al. |
| 5,373,182 A | 12/1994 | Norton |
| 5,381,431 A | 1/1995 | Zayhowski |
| 5,383,217 A | 1/1995 | Uemura |
| 5,390,201 A | 2/1995 | Tomono et al. |
| 5,410,168 A | 4/1995 | Hisa |
| 5,413,100 A | 5/1995 | Barthelemy et al. |
| 5,449,626 A | 9/1995 | Hezel |
| 5,454,347 A | 10/1995 | Shibata et al. |
| 5,502,329 A | 3/1996 | Pezzani |
| 5,507,881 A | 4/1996 | Sichanugrist et al. |
| 5,523,570 A | 6/1996 | Hairston |
| 5,559,361 A | 9/1996 | Pezzani |
| 5,569,615 A | 10/1996 | Yamazaki et al. |
| 5,569,624 A | 10/1996 | Weiner |
| 5,578,858 A | 11/1996 | Mueller et al. |
| 5,580,615 A | 12/1996 | Itoh et al. |
| 5,583,704 A | 12/1996 | Fujii |
| 5,589,008 A | 12/1996 | Keppner |
| 5,589,704 A | 12/1996 | Levine |
| 5,597,621 A | 1/1997 | Hummel et al. |
| 5,600,130 A | 2/1997 | VanZeghbroeck |
| 5,626,687 A | 5/1997 | Campbell |
| 5,627,081 A | 5/1997 | Tsuo et al. |
| 5,635,089 A | 6/1997 | Singh et al. |
| 5,640,013 A | 6/1997 | Ishikawa et al. |
| 5,641,362 A | 6/1997 | Meier |
| 5,641,969 A | 6/1997 | Cooke et al. |
| 5,705,413 A | 1/1998 | Harkin et al. |
| 5,705,828 A | 1/1998 | Noguchi et al. |
| 5,708,486 A | 1/1998 | Miyawaki et al. |
| 5,710,442 A | 1/1998 | Watanabe et al. |
| 5,714,404 A | 2/1998 | Mitlitsky et al. |
| 5,727,096 A | 3/1998 | Ghirardi et al. |
| 5,731,213 A | 3/1998 | Ono |
| 5,751,005 A | 5/1998 | Wyles et al. |
| 5,758,644 A | 6/1998 | Diab et al. |
| 5,766,127 A | 6/1998 | Pologe et al. |
| 5,766,964 A | 6/1998 | Rohatgi et al. |
| 5,773,820 A | 6/1998 | Osajda et al. |
| 5,779,631 A | 7/1998 | Chance |
| 5,781,392 A | 7/1998 | Clark |
| 5,792,280 A | 8/1998 | Ruby et al. |

(56) References Cited

U.S. PATENT DOCUMENTS

| | | |
|---|---|---|
| 5,802,091 A | 9/1998 | Chakrabarti et al. |
| 5,808,350 A | 9/1998 | Jack et al. |
| 5,859,446 A | 1/1999 | Nagasu et al. |
| 5,861,639 A | 1/1999 | Bernier |
| 5,871,826 A | 2/1999 | Mei |
| 5,898,672 A | 4/1999 | Ginzboorg |
| 5,918,140 A | 6/1999 | Wickboldt et al. |
| 5,923,071 A | 7/1999 | Saito |
| 5,935,320 A | 8/1999 | Graef et al. |
| 5,942,789 A | 8/1999 | Morikawa |
| 5,943,584 A | 8/1999 | Shim et al. |
| 5,963,790 A | 10/1999 | Matsuno et al. |
| 5,977,515 A | 11/1999 | Uraki et al. |
| 5,977,603 A | 11/1999 | Ishikawa |
| 5,995,606 A | 11/1999 | Civanlar et al. |
| 6,019,796 A | 2/2000 | Mei |
| 6,048,588 A | 4/2000 | Engelsberg |
| 6,049,058 A | 4/2000 | Dulaney et al. |
| 6,071,796 A | 6/2000 | Voutsas |
| 6,072,117 A | 6/2000 | Matsuyama et al. |
| 6,080,988 A | 6/2000 | Ishizuya et al. |
| 6,082,858 A | 7/2000 | Grace et al. |
| 6,097,031 A | 8/2000 | Cole |
| 6,106,689 A | 8/2000 | Matsuyama |
| 6,107,618 A | 8/2000 | Fossum et al. |
| 6,111,300 A | 8/2000 | Cao et al. |
| 6,117,499 A | 9/2000 | Wong et al. |
| 6,121,130 A | 9/2000 | Chua et al. |
| 6,128,379 A | 10/2000 | Smyk |
| 6,131,511 A | 10/2000 | Wachi et al. |
| 6,131,512 A | 10/2000 | Verlinden et al. |
| 6,147,297 A | 11/2000 | Wettling et al. |
| 6,160,833 A | 12/2000 | Floyd et al. |
| 6,168,965 B1 | 1/2001 | Malinovich et al. |
| 6,194,722 B1 | 2/2001 | Fiorini et al. |
| 6,204,506 B1 | 3/2001 | Akahori et al. |
| 6,229,192 B1 | 5/2001 | Gu |
| 6,242,291 B1 | 6/2001 | Kusumoto et al. |
| 6,252,256 B1 | 6/2001 | Ugge et al. |
| 6,272,768 B1 | 8/2001 | Danese |
| 6,290,713 B1 | 9/2001 | Russell |
| 6,291,302 B1 | 9/2001 | Yu |
| 6,313,901 B1 | 11/2001 | Cacharelis |
| 6,320,296 B1 | 11/2001 | Fujii et al. |
| 6,327,022 B1 | 12/2001 | Nishi |
| 6,331,445 B1 | 12/2001 | Janz et al. |
| 6,331,885 B1 | 12/2001 | Nishi |
| 6,333,485 B1 | 12/2001 | Haight et al. |
| 6,340,281 B1 | 1/2002 | Haraguchi et al. |
| 6,372,536 B1 | 4/2002 | Fischer et al. |
| 6,372,591 B1 | 4/2002 | Mineji et al. |
| 6,372,611 B1 | 4/2002 | Horikawa |
| 6,379,979 B1 | 4/2002 | Connolly |
| 6,420,706 B1 | 7/2002 | Lurie et al. |
| 6,429,036 B1 | 8/2002 | Nixon et al. |
| 6,429,037 B1 | 8/2002 | Wenham et al. |
| 6,457,478 B1 | 10/2002 | Danese |
| 6,465,860 B2 | 10/2002 | Shigenaka et al. |
| 6,475,839 B2 | 11/2002 | Zhang et al. |
| 6,479,093 B2 | 11/2002 | Lauffer et al. |
| 6,483,116 B1 | 11/2002 | Kozlowski et al. |
| 6,483,929 B1 | 11/2002 | Murakami et al. |
| 6,486,046 B2 | 11/2002 | Fujimura et al. |
| 6,486,522 B1 | 11/2002 | Bishay et al. |
| 6,493,567 B1 | 12/2002 | Krivitski et al. |
| 6,498,336 B1 | 12/2002 | Tian et al. |
| 6,500,690 B1 | 12/2002 | Yamagishi et al. |
| 6,504,178 B2 | 1/2003 | Carlson et al. |
| 6,504,292 B1 * | 1/2003 | Choi ............ H01J 1/304 313/309 |
| 6,562,705 B1 | 5/2003 | Obara |
| 6,580,053 B1 | 6/2003 | Voutsas |
| 6,583,936 B1 | 6/2003 | Kaminsky et al. |
| 6,586,318 B1 | 7/2003 | Lu |
| 6,597,025 B2 | 7/2003 | Lauter et al. |
| 6,607,927 B2 | 8/2003 | Ramappa et al. |
| 6,624,049 B1 | 9/2003 | Yamazaki |
| 6,639,253 B2 | 10/2003 | Duane et al. |
| 6,653,554 B2 | 11/2003 | Ishihara |
| 6,667,528 B2 | 12/2003 | Cohen et al. |
| 6,677,655 B2 | 1/2004 | Fitzergald |
| 6,677,656 B2 | 1/2004 | François |
| 6,683,326 B2 | 1/2004 | Iguchi et al. |
| 6,689,209 B2 | 2/2004 | Falster et al. |
| 6,690,968 B2 | 2/2004 | Mejia |
| 6,734,455 B2 | 5/2004 | Li |
| 6,753,585 B1 | 6/2004 | Kindt |
| 6,756,104 B2 | 6/2004 | Sokol et al. |
| 6,759,262 B2 | 7/2004 | Theil et al. |
| 6,790,701 B2 | 9/2004 | Shigenaka et al. |
| 6,796,144 B2 | 9/2004 | Shepard et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,876,003 B1 | 4/2005 | Nakamura et al. |
| 6,897,118 B1 | 5/2005 | Poon et al. |
| 6,900,839 B1 | 5/2005 | Kozlowski et al. |
| 6,907,135 B2 | 6/2005 | Gifford et al. |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,112,545 B1 | 9/2006 | Railkar et al. |
| 7,126,212 B2 | 10/2006 | Enquist et al. |
| 7,132,724 B1 | 11/2006 | Merrill |
| 7,202,102 B2 | 4/2007 | Yao |
| 7,211,214 B2 | 5/2007 | Chou |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,315,014 B2 | 1/2008 | Lee et al. |
| 7,326,380 B2 * | 2/2008 | Mirkin ............ G03F 7/0002 264/104 |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,413,909 B2 | 8/2008 | Hutchens et al. |
| 7,425,471 B2 | 9/2008 | Bruland et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Masur et al. |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |

(56) References Cited

U.S. PATENT DOCUMENTS

| | | | |
|---|---|---|---|
| 7,560,750 B2 | 7/2009 | Niira et al. |
| 7,564,631 B2 | 7/2009 | Li et al. |
| 7,569,503 B2 | 8/2009 | Pan |
| 7,582,515 B2 | 9/2009 | Choi et al. |
| 7,586,601 B2 | 9/2009 | Ebstein |
| 7,592,593 B2 | 9/2009 | Kauffman et al. |
| 7,595,213 B2 | 9/2009 | Kwon et al. |
| 7,605,064 B2 | 10/2009 | Kizilyalli et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,234 B2 | 12/2009 | Bruland |
| 7,629,582 B2 | 12/2009 | Hoffman et al. |
| 7,648,851 B2 | 1/2010 | Fu et al. |
| 7,649,156 B2 | 1/2010 | Lee |
| 7,687,740 B2 | 3/2010 | Bruland et al. |
| 7,705,879 B2 | 4/2010 | Kerr et al. |
| 7,728,274 B2 | 6/2010 | Pilla et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 | 11/2010 | Weber et al. |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 * | 2/2011 | Mazur .............. H01L 21/02532 |
| | | | 257/618 |
| 7,897,942 B1 | 3/2011 | Bareket et al. |
| 7,910,964 B2 | 3/2011 | Kawahito et al. |
| 7,923,801 B2 | 4/2011 | Tian et al. |
| 7,935,941 B2 | 5/2011 | Bruland et al. |
| 7,968,834 B2 | 6/2011 | Veeder |
| 8,008,205 B2 | 8/2011 | Fukushima et al. |
| 8,013,411 B2 | 9/2011 | Cole |
| 8,030,726 B2 | 10/2011 | Sumi |
| 8,035,343 B2 | 10/2011 | Seman, Jr. |
| 8,058,615 B2 | 11/2011 | McCaffrey et al. |
| 8,076,746 B2 | 12/2011 | McCarten et al. |
| 8,080,467 B2 | 12/2011 | Carey, III et al. |
| 8,088,219 B2 | 1/2012 | Knerer et al. |
| 8,093,559 B1 | 1/2012 | Rajavel |
| RE43,169 E | 2/2012 | Parker |
| 8,120,027 B2 | 2/2012 | Forbes |
| 8,143,686 B2 | 3/2012 | Mazur et al. |
| 8,143,688 B2 | 3/2012 | McCaffrey et al. |
| 8,164,126 B2 | 4/2012 | Moon et al. |
| 8,207,051 B2 | 6/2012 | Sickler et al. |
| 8,247,259 B2 | 8/2012 | Grolier et al. |
| 8,259,293 B2 | 9/2012 | Andreou et al. |
| 8,268,403 B2 | 9/2012 | Akiyama et al. |
| 8,288,702 B2 | 10/2012 | Veeder |
| 8,309,389 B1 | 11/2012 | Alie et al. |
| 8,355,545 B2 | 1/2013 | Corcoran et al. |
| 8,445,950 B2 | 5/2013 | Iida et al. |
| 8,445,985 B2 | 5/2013 | Hiyama et al. |
| 8,456,546 B2 | 6/2013 | Oike |
| 8,470,619 B2 | 6/2013 | Bour et al. |
| 8,476,598 B1 | 7/2013 | Pralle et al. |
| 8,476,681 B2 | 7/2013 | Haddad et al. |
| 8,530,264 B2 | 9/2013 | De Munck et al. |
| 8,564,087 B2 | 10/2013 | Yamamura et al. |
| 8,598,051 B2 | 12/2013 | Mazur et al. |
| 8,603,902 B2 | 12/2013 | Mazur et al. |
| 8,604,405 B2 | 12/2013 | Liu et al. |
| 8,604,580 B2 | 12/2013 | Mazur et al. |
| 8,629,485 B2 | 1/2014 | Yamamura et al. |
| 8,649,568 B2 | 2/2014 | Sato |
| 8,674,316 B1 | 3/2014 | Pralle et al. |
| 8,679,959 B2 | 3/2014 | Carey et al. |
| 8,680,591 B2 | 3/2014 | Haddad et al. |
| 8,680,642 B2 | 3/2014 | McCaffrey et al. |
| 8,692,198 B2 | 4/2014 | Jiang et al. |
| 8,698,272 B2 | 4/2014 | Vineis |
| 8,704,145 B2 | 4/2014 | Veeder |
| 8,723,094 B2 | 5/2014 | McKee et al. |
| 8,729,678 B2 | 5/2014 | Shim et al. |
| 8,742,528 B2 | 6/2014 | Yamamura et al. |
| 8,802,549 B2 | 8/2014 | Sickler et al. |
| 8,884,226 B2 | 11/2014 | Miyazaki et al. |
| 8,895,839 B2 | 11/2014 | Mazur et al. |
| 8,906,670 B2 | 12/2014 | Gray et al. |
| 8,916,945 B2 | 12/2014 | Sakamoto et al. |
| 8,926,868 B2 * | 1/2015 | Selvamanickam ... H01L 39/143 |
| | | | 252/506 |
| 8,928,784 B2 | 1/2015 | Watanabe et al. |
| 8,994,135 B2 | 3/2015 | Yamamura et al. |
| 9,064,762 B2 | 6/2015 | Yamaguchi |
| 9,064,764 B2 | 6/2015 | Pralle et al. |
| 9,136,146 B2 | 9/2015 | Mazur et al. |
| 9,184,204 B2 | 11/2015 | Hu |
| 9,190,551 B2 | 11/2015 | Yamamura et al. |
| 9,209,345 B2 | 12/2015 | Haddad et al. |
| 9,276,143 B2 | 3/2016 | Mazur |
| 9,369,641 B2 | 6/2016 | Hu |
| 9,419,159 B2 | 8/2016 | Sakamoto et al. |
| 9,478,572 B2 | 10/2016 | Miyanami |
| 9,496,308 B2 | 11/2016 | Haddad et al. |
| 9,559,215 B1 | 1/2017 | Ahmed |
| 9,659,984 B2 | 5/2017 | Ohkubo et al. |
| 9,666,636 B2 | 5/2017 | Haddad et al. |
| 9,673,250 B2 | 6/2017 | Haddad et al. |
| 9,741,761 B2 | 8/2017 | Jiang et al. |
| 9,761,739 B2 | 9/2017 | Carey et al. |
| 9,762,830 B2 | 9/2017 | Jiang et al. |
| 9,793,425 B2 | 10/2017 | Mazur et al. |
| 9,905,599 B2 | 2/2018 | Pralle et al. |
| 9,911,781 B2 | 3/2018 | Haddad et al. |
| 9,939,251 B2 | 4/2018 | Haddad et al. |
| 10,224,359 B2 | 3/2019 | Pralle et al. |
| 10,229,951 B2 | 3/2019 | Jiang et al. |
| 10,244,188 B2 | 3/2019 | Saylor et al. |
| 10,269,861 B2 | 4/2019 | Haddad et al. |
| 10,347,682 B2 | 7/2019 | Haddad et al. |
| 10,361,083 B2 | 7/2019 | Mazur et al. |
| 10,361,232 B2 | 7/2019 | Haddad et al. |
| 10,374,109 B2 | 8/2019 | Mazur et al. |
| 10,484,855 B2 | 11/2019 | Haddad et al. |
| 10,505,054 B2 | 12/2019 | Carey et al. |
| 2001/0017344 A1 | 8/2001 | Aebi |
| 2001/0022768 A1 | 9/2001 | Takahashi |
| 2001/0044175 A1 | 11/2001 | Barrett et al. |
| 2001/0044251 A1 | 11/2001 | Cho et al. |
| 2001/0044266 A1 | 11/2001 | Katsuoka et al. |
| 2002/0008298 A1 * | 1/2002 | Akram .............. H01L 21/76208 |
| | | | 257/510 |
| 2002/0020893 A1 | 2/2002 | Lhorte |
| 2002/0024618 A1 | 2/2002 | Imai |
| 2002/0034845 A1 | 3/2002 | Fujimura et al. |
| 2002/0056845 A1 | 5/2002 | Iguchi et al. |
| 2002/0060322 A1 | 5/2002 | Tanabe et al. |
| 2002/0079290 A1 | 6/2002 | Holdermann |
| 2002/0117699 A1 | 8/2002 | Francois |
| 2002/0126333 A1 | 9/2002 | Hosono et al. |
| 2002/0135869 A1 * | 9/2002 | Banish .............. H01L 31/0236 |
| | | | 359/350 |
| 2002/0148964 A1 | 10/2002 | Dausch et al. |
| 2002/0176650 A1 | 11/2002 | Zhao et al. |
| 2002/0182769 A1 | 12/2002 | Campbell |
| 2003/0001497 A1 * | 1/2003 | Kinoshita .............. B82Y 10/00 |
| | | | 313/532 |
| 2003/0016708 A1 | 1/2003 | Albrecht et al. |
| 2003/0024269 A1 | 2/2003 | Shepard et al. |
| 2003/0025156 A1 | 2/2003 | Yamazaki et al. |
| 2003/0029495 A1 | 2/2003 | Mazur et al. |

(56) References Cited

U.S. PATENT DOCUMENTS

| | | |
|---|---|---|
| 2003/0030083 A1 | 2/2003 | Lee et al. |
| 2003/0045074 A1 | 3/2003 | Seibel et al. |
| 2003/0045092 A1 | 3/2003 | Shin |
| 2003/0057357 A1 | 3/2003 | Uppal et al. |
| 2003/0111106 A1 | 6/2003 | Nagano et al. |
| 2003/0132449 A1 | 7/2003 | Hosono et al. |
| 2003/0183270 A1 | 10/2003 | Falk et al. |
| 2003/0210332 A1 | 11/2003 | Frame |
| 2003/0213515 A1 | 11/2003 | Sano et al. |
| 2003/0214595 A1 | 11/2003 | Mabuchi |
| 2003/0228883 A1 | 12/2003 | Kusakari et al. |
| 2004/0014307 A1 | 1/2004 | Shin et al. |
| 2004/0016886 A1 | 1/2004 | Ringermacher et al. |
| 2004/0041168 A1 | 3/2004 | Hembree et al. |
| 2004/0046224 A1 | 3/2004 | Rossel et al. |
| 2004/0067339 A1* | 4/2004 | Gandon ............ B32B 17/10036 428/141 |
| 2004/0077117 A1 | 4/2004 | Ding et al. |
| 2004/0080638 A1 | 4/2004 | Lee |
| 2004/0112426 A1 | 6/2004 | Hagino |
| 2004/0130020 A1 | 7/2004 | Kuwabara et al. |
| 2004/0161868 A1 | 8/2004 | Hong et al. |
| 2004/0169834 A1 | 9/2004 | Richter et al. |
| 2004/0222187 A1 | 11/2004 | Lin |
| 2004/0235670 A1* | 11/2004 | Crisan ................. H01L 39/2483 505/100 |
| 2004/0252931 A1 | 12/2004 | Belleville et al. |
| 2004/0256561 A1 | 12/2004 | Beuhler et al. |
| 2005/0032249 A1 | 2/2005 | Im et al. |
| 2005/0040440 A1 | 2/2005 | Murakami |
| 2005/0051822 A1 | 3/2005 | Manning |
| 2005/0062041 A1 | 3/2005 | Terakawa et al. |
| 2005/0063566 A1 | 3/2005 | Beek et al. |
| 2005/0067935 A1* | 3/2005 | Lee ....................... H01J 1/3044 313/309 |
| 2005/0072097 A1 | 4/2005 | Holloway |
| 2005/0088634 A1 | 4/2005 | Kosugi et al. |
| 2005/0093100 A1 | 5/2005 | Chen et al. |
| 2005/0098204 A1* | 5/2005 | Roscheisen ............ B82Y 10/00 136/263 |
| 2005/0101100 A1 | 5/2005 | Kretchmer et al. |
| 2005/0101160 A1 | 5/2005 | Garg et al. |
| 2005/0106562 A1* | 5/2005 | Abbott .................... B82Y 30/00 435/5 |
| 2005/0127401 A1 | 6/2005 | Mazur et al. |
| 2005/0134698 A1 | 6/2005 | Schroeder et al. |
| 2005/0150542 A1 | 7/2005 | Madan |
| 2005/0158969 A1 | 7/2005 | Binns et al. |
| 2005/0184291 A1 | 8/2005 | Cole et al. |
| 2005/0184353 A1 | 8/2005 | Mouli |
| 2005/0194598 A1* | 9/2005 | Kim ........................ H01L 33/08 257/79 |
| 2005/0211996 A1 | 9/2005 | Krishna et al. |
| 2005/0226287 A1 | 10/2005 | Shah et al. |
| 2005/0227390 A1 | 10/2005 | Shtein |
| 2005/0227457 A1 | 10/2005 | Kondo et al. |
| 2005/0272885 A1* | 12/2005 | Mirkin ................... G03F 7/0002 526/72 |
| 2006/0006482 A1 | 1/2006 | Rieve et al. |
| 2006/0011954 A1 | 1/2006 | Ueda et al. |
| 2006/0011955 A1 | 1/2006 | Baggenstoss |
| 2006/0014012 A1* | 1/2006 | Thies ..................... G02B 1/105 428/323 |
| 2006/0060848 A1 | 3/2006 | Chang et al. |
| 2006/0071254 A1 | 4/2006 | Rhodes |
| 2006/0079062 A1 | 4/2006 | Mazur et al. |
| 2006/0086956 A1 | 4/2006 | Furukawa et al. |
| 2006/0097172 A1 | 5/2006 | Park |
| 2006/0097290 A1 | 5/2006 | Hietanen |
| 2006/0102901 A1 | 5/2006 | Im et al. |
| 2006/0118781 A1 | 6/2006 | Rhodes |
| 2006/0121680 A1 | 6/2006 | Tanaka |
| 2006/0128087 A1 | 6/2006 | Bamji et al. |
| 2006/0132633 A1 | 6/2006 | Nam et al. |
| 2006/0138396 A1 | 6/2006 | Lin et al. |
| 2006/0145148 A1 | 7/2006 | Hirai et al. |
| 2006/0145176 A1 | 7/2006 | Lee |
| 2006/0160343 A1 | 7/2006 | Chong et al. |
| 2006/0166475 A1 | 7/2006 | Mantl |
| 2006/0175529 A1 | 8/2006 | Harmon et al. |
| 2006/0180885 A1 | 8/2006 | Rhodes |
| 2006/0181627 A1 | 8/2006 | Farrier |
| 2006/0210122 A1 | 9/2006 | Cleveland et al. |
| 2006/0214121 A1 | 9/2006 | Schrey et al. |
| 2006/0228897 A1 | 10/2006 | Timans |
| 2006/0231853 A1 | 10/2006 | Tanaka |
| 2006/0231914 A1 | 10/2006 | Carey et al. |
| 2006/0238632 A1 | 10/2006 | Shah |
| 2006/0244090 A1 | 11/2006 | Roy et al. |
| 2006/0255340 A1 | 11/2006 | Manivannan et al. |
| 2006/0257140 A1 | 11/2006 | Seger et al. |
| 2006/0261372 A1 | 11/2006 | Yoshioka |
| 2006/0286305 A1* | 12/2006 | Thies ..................... B82Y 30/00 427/508 |
| 2007/0035849 A1 | 2/2007 | Li et al. |
| 2007/0035879 A1 | 2/2007 | Hall et al. |
| 2007/0051876 A1 | 3/2007 | Sumi et al. |
| 2007/0052050 A1 | 3/2007 | Dierickx |
| 2007/0063219 A1 | 3/2007 | Sa'ar et al. |
| 2007/0076481 A1 | 4/2007 | Tennant |
| 2007/0102709 A1 | 5/2007 | Burgener et al. |
| 2007/0103580 A1 | 5/2007 | Noto |
| 2007/0115554 A1 | 5/2007 | Breitung et al. |
| 2007/0123005 A1 | 5/2007 | Hiura et al. |
| 2007/0125951 A1 | 6/2007 | Snider et al. |
| 2007/0131275 A1 | 6/2007 | Kinsey et al. |
| 2007/0138590 A1 | 6/2007 | Wells et al. |
| 2007/0145505 A1 | 6/2007 | Kim et al. |
| 2007/0178672 A1 | 8/2007 | Tanaka et al. |
| 2007/0187670 A1 | 8/2007 | Hsu et al. |
| 2007/0189583 A1 | 8/2007 | Shimada et al. |
| 2007/0194356 A1 | 8/2007 | Moon et al. |
| 2007/0194401 A1 | 8/2007 | Nagai et al. |
| 2007/0195056 A1 | 8/2007 | Lloyd |
| 2007/0200940 A1 | 8/2007 | Gruhlke et al. |
| 2007/0201859 A1 | 8/2007 | Sarrat |
| 2007/0235827 A1 | 10/2007 | Altice |
| 2007/0237504 A1 | 10/2007 | Nakashiba |
| 2007/0243701 A1 | 10/2007 | Ito et al. |
| 2007/0247414 A1 | 10/2007 | Roberts |
| 2007/0262366 A1 | 11/2007 | Baek et al. |
| 2007/0290283 A1 | 12/2007 | Park et al. |
| 2007/0293056 A1 | 12/2007 | Setsuhara et al. |
| 2007/0296060 A1 | 12/2007 | Tanabe et al. |
| 2007/0298533 A1 | 12/2007 | Yang et al. |
| 2008/0002863 A1 | 1/2008 | Northcott et al. |
| 2008/0020555 A1 | 1/2008 | Shimomura et al. |
| 2008/0026550 A1 | 1/2008 | Werner et al. |
| 2008/0036022 A1 | 2/2008 | Hwang et al. |
| 2008/0044943 A1 | 2/2008 | Mazur et al. |
| 2008/0076240 A1 | 3/2008 | Veschetti et al. |
| 2008/0099804 A1 | 5/2008 | Venezia et al. |
| 2008/0121280 A1 | 5/2008 | Carnel et al. |
| 2008/0121805 A1 | 5/2008 | Tweet et al. |
| 2008/0135099 A1 | 6/2008 | Yu |
| 2008/0142686 A1 | 6/2008 | Konno et al. |
| 2008/0158398 A1 | 7/2008 | Yaffe et al. |
| 2008/0170173 A1 | 7/2008 | Park et al. |
| 2008/0173620 A1 | 7/2008 | Grek et al. |
| 2008/0174685 A1 | 7/2008 | Shan et al. |
| 2008/0178932 A1 | 7/2008 | Den Boer et al. |
| 2008/0179762 A1 | 7/2008 | Cho et al. |
| 2008/0191296 A1 | 8/2008 | Wang et al. |
| 2008/0191310 A1 | 8/2008 | Wu et al. |
| 2008/0192132 A1 | 8/2008 | Bechtel et al. |
| 2008/0192133 A1 | 8/2008 | Abiru et al. |
| 2008/0196761 A1 | 8/2008 | Nakano et al. |
| 2008/0198251 A1 | 8/2008 | Xu |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0251812 A1 | 10/2008 | Yoo |

(56) References Cited

U.S. PATENT DOCUMENTS

| | | |
|---|---|---|
| 2008/0257409 A1 | 10/2008 | Li et al. |
| 2008/0258604 A1 | 10/2008 | Mazur et al. |
| 2008/0266434 A1 | 10/2008 | Sugawa |
| 2008/0266435 A1 | 10/2008 | Agranov et al. |
| 2008/0281174 A1 | 11/2008 | Dietiker |
| 2008/0284884 A1 | 11/2008 | Makino et al. |
| 2008/0303932 A1 | 12/2008 | Wang et al. |
| 2008/0309913 A1 | 12/2008 | Fallon |
| 2009/0002528 A1 | 1/2009 | Manabe et al. |
| 2009/0009596 A1 | 1/2009 | Kerr et al. |
| 2009/0014056 A1 | 1/2009 | Hockaday |
| 2009/0014842 A1 | 1/2009 | Mazur et al. |
| 2009/0027640 A1 | 1/2009 | Shibazaki et al. |
| 2009/0036783 A1 | 2/2009 | Kishima |
| 2009/0038669 A1 | 2/2009 | Atanackovic |
| 2009/0039397 A1 | 2/2009 | Chao |
| 2009/0050944 A1 | 2/2009 | Hong et al. |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0090988 A1 | 4/2009 | Ohgishi |
| 2009/0095887 A1 | 4/2009 | Saveliev |
| 2009/0096049 A1 | 4/2009 | Oshiyama et al. |
| 2009/0101197 A1 | 4/2009 | Morikawa |
| 2009/0109305 A1 | 4/2009 | Dai et al. |
| 2009/0114630 A1 | 5/2009 | Hawryluk |
| 2009/0142879 A1 | 6/2009 | Isaka et al. |
| 2009/0146240 A1 | 6/2009 | Carey, III et al. |
| 2009/0151785 A1 | 6/2009 | Naum et al. |
| 2009/0160983 A1 | 6/2009 | Lenchenkov |
| 2009/0162966 A1 | 6/2009 | Jawarani et al. |
| 2009/0174026 A1 | 7/2009 | Carey, III et al. |
| 2009/0179199 A1 | 7/2009 | Sano et al. |
| 2009/0180010 A1 | 7/2009 | Adkisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200625 A1 | 8/2009 | Venezia et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0206356 A1 | 8/2009 | Tsuchiya |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242019 A1 | 10/2009 | Ramamoorthy et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1 | 10/2009 | Tatani et al. |
| 2009/0261255 A1 | 10/2009 | Nakamura et al. |
| 2009/0273695 A1 | 11/2009 | Mabuchi |
| 2009/0278967 A1 | 11/2009 | Toumiya |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2009/0308457 A1 | 12/2009 | Smith |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey et al. |
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1 | 3/2010 | Gidon et al. |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |
| 2010/0102206 A1 | 4/2010 | Cazaux et al. |
| 2010/0102366 A1 | 4/2010 | Lee et al. |
| 2010/0108864 A1 | 5/2010 | Ohta et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |
| 2010/0128161 A1 | 5/2010 | Yamaguchi |
| 2010/0128937 A1 | 5/2010 | Yoo et al. |
| 2010/0133635 A1 | 6/2010 | Lee et al. |
| 2010/0140733 A1 | 6/2010 | Lee et al. |
| 2010/0140768 A1 | 6/2010 | Zafiropoulo et al. |
| 2010/0143744 A1 | 6/2010 | Gupta et al. |
| 2010/0147383 A1 | 6/2010 | Carey et al. |
| 2010/0171948 A1 | 7/2010 | Mazur et al. |
| 2010/0190292 A1 | 7/2010 | Alberts |
| 2010/0200658 A1 | 8/2010 | Olmstead et al. |
| 2010/0201834 A1 | 8/2010 | Maruyama et al. |
| 2010/0210930 A1 | 8/2010 | Saylor |
| 2010/0213582 A9 | 8/2010 | Coullard et al. |
| 2010/0219506 A1 | 9/2010 | Gupta et al. |
| 2010/0224229 A1 | 9/2010 | Pralle et al. |
| 2010/0240169 A1 | 9/2010 | Petti et al. |
| 2010/0240203 A1 | 9/2010 | Carey, III et al. |
| 2010/0244174 A1 | 9/2010 | McCaffrey et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0003424 A1 | 1/2011 | De Ceuster et al. |
| 2011/0019050 A1 | 1/2011 | Yamashita |
| 2011/0025842 A1 | 2/2011 | King et al. |
| 2011/0031471 A1 | 2/2011 | Mazur et al. |
| 2011/0045244 A1 | 2/2011 | Mazur et al. |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0100441 A1 | 5/2011 | Mazur et al. |
| 2011/0104850 A1 | 5/2011 | Weidman et al. |
| 2011/0121206 A1 | 5/2011 | Mazur et al. |
| 2011/0127567 A1 | 6/2011 | Seong |
| 2011/0140106 A1 | 6/2011 | Forbes |
| 2011/0140221 A1 | 6/2011 | Venezia et al. |
| 2011/0150304 A1 | 6/2011 | Abe et al. |
| 2011/0194100 A1 | 8/2011 | Thiel et al. |
| 2011/0220971 A1 | 9/2011 | Haddad et al. |
| 2011/0227138 A1 | 9/2011 | Haddad et al. |
| 2011/0241148 A1 | 10/2011 | Hiyama et al. |
| 2011/0241152 A1 | 10/2011 | Hsiao et al. |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0272583 A1 | 11/2011 | Veeder |
| 2011/0292380 A1 | 12/2011 | Bamji |
| 2011/0303999 A1 | 12/2011 | Sakamoto et al. |
| 2012/0001841 A1 | 1/2012 | Gokingco et al. |
| 2012/0024363 A1 | 2/2012 | Dimer et al. |
| 2012/0024364 A1 | 2/2012 | Carey, III et al. |
| 2012/0025199 A1 | 2/2012 | Chen et al. |
| 2012/0038811 A1 | 2/2012 | Ellis-Monaghan et al. |
| 2012/0043637 A1 | 2/2012 | King et al. |
| 2012/0049242 A1 | 3/2012 | Atanackovic et al. |
| 2012/0049306 A1 | 3/2012 | Ohba et al. |
| 2012/0080733 A1 | 4/2012 | Doan et al. |
| 2012/0111396 A1 | 5/2012 | Saylor et al. |
| 2012/0147241 A1 | 6/2012 | Yamaguchi et al. |
| 2012/0153127 A1 | 6/2012 | Hirigoyen et al. |

(56) References Cited

U.S. PATENT DOCUMENTS

| | | |
|---|---|---|
| 2012/0153128 A1 | 6/2012 | Roy et al. |
| 2012/0171804 A1 | 7/2012 | Moslehi et al. |
| 2012/0187190 A1 | 7/2012 | Wang et al. |
| 2012/0188431 A1 | 7/2012 | Takimoto |
| 2012/0214260 A1 | 8/2012 | Sickler et al. |
| 2012/0217602 A1 | 8/2012 | Enomoto |
| 2012/0222396 A1 | 9/2012 | Clemen |
| 2012/0228473 A1 | 9/2012 | Yoshitsugu |
| 2012/0274744 A1 | 11/2012 | Wan et al. |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | McKee et al. |
| 2013/0001553 A1 | 1/2013 | Vineis et al. |
| 2013/0020468 A1 | 1/2013 | Mitsuhashi et al. |
| 2013/0026531 A1 | 1/2013 | Seo et al. |
| 2013/0062522 A1 | 3/2013 | Jiang et al. |
| 2013/0075852 A1 | 3/2013 | McCaffrey et al. |
| 2013/0082343 A1 | 4/2013 | Fudaba et al. |
| 2013/0099103 A1 | 4/2013 | Veeder |
| 2013/0135439 A1 | 5/2013 | Kakuko et al. |
| 2013/0168792 A1 | 7/2013 | Haddad et al. |
| 2013/0168803 A1 | 7/2013 | Haddad et al. |
| 2013/0200251 A1 | 8/2013 | Velichko |
| 2013/0207212 A1 | 8/2013 | Mao et al. |
| 2013/0207214 A1 | 8/2013 | Haddad et al. |
| 2013/0285130 A1 | 10/2013 | Ting et al. |
| 2014/0054662 A1 | 2/2014 | Yanagita et al. |
| 2014/0060737 A1 | 3/2014 | Mazur et al. |
| 2014/0099745 A1 | 4/2014 | Mazur et al. |
| 2014/0138785 A1 | 5/2014 | Pralle |
| 2014/0198240 A1 | 7/2014 | Rhoads |
| 2014/0247378 A1 | 9/2014 | Sharma et al. |
| 2014/0307059 A1 | 10/2014 | Haddad et al. |
| 2014/0313386 A1 | 10/2014 | Jiang et al. |
| 2014/0332665 A1 | 11/2014 | Jiang et al. |
| 2014/0352779 A1 | 12/2014 | Smirnov et al. |
| 2014/0374868 A1 | 12/2014 | Lee et al. |
| 2015/0014803 A1 | 1/2015 | Haddad |
| 2015/0076468 A1 | 3/2015 | Yamaguchi et al. |
| 2015/0270306 A1 | 9/2015 | Haddad |
| 2015/0349150 A1 | 12/2015 | Carey et al. |
| 2015/0372040 A1 | 12/2015 | Pralle et al. |
| 2016/0005608 A1 | 1/2016 | Mazur et al. |
| 2016/0035782 A1 | 2/2016 | Haddad et al. |
| 2016/0119555 A1 | 4/2016 | Saylor et al. |
| 2016/0155864 A1 | 6/2016 | Mazur et al. |
| 2016/0329366 A1 | 11/2016 | Pralle et al. |
| 2017/0025467 A1 | 1/2017 | Haddad et al. |
| 2017/0141258 A1 | 5/2017 | McFarland |
| 2017/0244920 A1 | 8/2017 | Ohkubo et al. |
| 2017/0263671 A1 | 9/2017 | Haddad et al. |
| 2017/0271391 A1 | 9/2017 | Haddad et al. |
| 2017/0271394 A1 | 9/2017 | Haddad et al. |
| 2017/0345951 A1 | 11/2017 | Carey et al. |
| 2017/0358621 A1 | 12/2017 | Jiang et al. |
| 2018/0083146 A1 | 3/2018 | Mazur et al. |
| 2018/0175093 A1 | 6/2018 | Haddad et al. |
| 2019/0198538 A1 | 6/2019 | Pralle et al. |
| 2019/0206923 A1 | 7/2019 | Jiang et al. |
| 2019/0222778 A1 | 7/2019 | Saylor et al. |
| 2019/0289451 A1 | 9/2019 | Haddad et al. |

FOREIGN PATENT DOCUMENTS

| | | |
|---|---|---|
| CN | 1614789 A | 5/2005 |
| CN | 101026776 A | 8/2007 |
| CN | 101053065 A | 10/2007 |
| CN | 101241923 A | 8/2008 |
| CN | 101404307 A | 4/2009 |
| CN | 101423942 A | 5/2009 |
| CN | 101465361 A | 6/2009 |
| CN | 101478013 A | 7/2009 |
| CN | 101634026 A | 1/2010 |
| CN | 101634027 A | 1/2010 |
| CN | 101740597 A | 6/2010 |
| CN | 101818348 A | 9/2010 |
| CN | 101877378 A | 11/2010 |
| CN | 201725796 U | 1/2011 |
| CN | 101978498 A | 2/2011 |
| CN | 102270646 A | 12/2011 |
| DE | 19838439 C1 | 4/2000 |
| EP | 0473439 A2 | 3/1992 |
| EP | 0566156 A1 | 10/1993 |
| EP | 1 347 670 A1 | 9/2003 |
| EP | 1630871 A1 | 3/2006 |
| EP | 1873840 A1 | 1/2008 |
| EP | 2073270 A2 | 6/2009 |
| EP | 2509107 A1 | 10/2012 |
| FR | 2827707 A1 | 1/2003 |
| GB | 2030766 A | 4/1980 |
| JP | S5771188 A | 5/1982 |
| JP | S57173966 A | 10/1982 |
| JP | S63116421 A | 5/1988 |
| JP | H02152226 A | 6/1990 |
| JP | H02237026 A | 9/1990 |
| JP | H03183037 A | 8/1991 |
| JP | H04318970 A | 11/1992 |
| JP | H06104414 A | 4/1994 |
| JP | H06244444 A | 9/1994 |
| JP | H06267868 A | 9/1994 |
| JP | H06275641 A | 9/1994 |
| JP | H0774240 A | 3/1995 |
| JP | H07183484 A | 7/1995 |
| JP | H07235658 A | 9/1995 |
| JP | 9148594 | 6/1997 |
| JP | H09298308 A | 11/1997 |
| JP | 11077348 | 3/1999 |
| JP | 11097724 | 4/1999 |
| JP | 200164914 A | 6/2000 |
| JP | 2001007381 A | 1/2001 |
| JP | 2001024936 A | 1/2001 |
| JP | 2001189478 A | 7/2001 |
| JP | 2001257927 A | 9/2001 |
| JP | 2001339057 A | 12/2001 |
| JP | 2002043594 A | 2/2002 |
| JP | 2002134640 A | 5/2002 |
| JP | 2002513176 A | 5/2002 |
| JP | 2002-190386 A | 7/2002 |
| JP | 2003058269 A | 2/2003 |
| JP | 2003104121 A | 4/2003 |
| JP | 2003163360 A | 6/2003 |
| JP | 2003242125 A | 8/2003 |
| JP | 2003258285 A | 9/2003 |
| JP | 2003308130 A | 10/2003 |
| JP | 2004047682 A | 2/2004 |
| JP | 2004273886 A | 9/2004 |
| JP | 2004273887 A | 9/2004 |
| JP | 2005072097 A | 3/2005 |
| JP | 2005339425 A | 12/2005 |
| JP | 2006033493 A | 2/2006 |
| JP | 2006147991 A | 6/2006 |
| JP | 2006173381 A | 6/2006 |
| JP | 2006210701 A | 8/2006 |
| JP | 2006255430 A | 9/2006 |
| JP | 2006261372 A | 9/2006 |
| JP | 2007122237 A | 5/2007 |
| JP | 2007135005 A | 5/2007 |
| JP | 2007165909 A | 6/2007 |
| JP | 2007180642 A | 7/2007 |
| JP | 2007180643 A | 7/2007 |
| JP | 2007203090 A | 8/2007 |
| JP | 2007258684 A | 10/2007 |
| JP | 2007305675 A | 11/2007 |
| JP | 2008099158 A | 4/2008 |
| JP | 2008153361 A | 7/2008 |
| JP | 2008167004 A | 7/2008 |
| JP | 2008181468 A | 8/2008 |
| JP | 2008187003 A | 8/2008 |
| JP | 2008283219 A | 11/2008 |
| JP | 2008294698 A | 12/2008 |

(56) References Cited

FOREIGN PATENT DOCUMENTS

| | | | |
|---|---|---|---|
| JP | 2009021479 A | 1/2009 | |
| JP | 2009026142 A | 2/2009 | |
| JP | 2009152569 A | 7/2009 | |
| JP | 2009206356 A | 9/2009 | |
| JP | 2009253683 A | 10/2009 | |
| JP | 2010226071 A | 10/2010 | |
| JP | 2010278472 A | 12/2010 | |
| JP | 2011003860 A | 1/2011 | |
| JP | 2011091128 A | 5/2011 | |
| JP | 2012054321 A | 3/2012 | |
| JP | 2012169530 A | 9/2012 | |
| JP | 2012191005 A | 10/2012 | |
| JP | 2012212349 A | 11/2012 | |
| KR | 20010061058 A | 7/2001 | |
| KR | 2005039273 | 4/2005 | |
| KR | 20060020400 A | 3/2006 | |
| KR | 20060052278 A | 5/2006 | |
| KR | 20080014301 A | 2/2008 | |
| KR | 100825808 B1 | 4/2008 | |
| KR | 20080097709 A | 11/2008 | |
| KR | 20090077274 A | 7/2009 | |
| KR | 20100026463 A | 3/2010 | |
| KR | 20100118864 A | 11/2010 | |
| KR | 20110079323 A | 7/2011 | |
| KR | 20170070266 A | 6/2017 | |
| TW | 200627675 A | 8/2006 | |
| TW | 200818529 A | 4/2008 | |
| WO | 9114284 A1 | 9/1991 | |
| WO | 2000031679 A1 | 6/2000 | |
| WO | 0131842 | 5/2001 | |
| WO | 0135601 | 5/2001 | |
| WO | 2002041363 A2 | 5/2002 | |
| WO | 2003059390 A1 | 7/2003 | |
| WO | 2005029599 A3 | 3/2005 | |
| WO | 2006043690 A1 | 4/2006 | |
| WO | 2006054758 A1 | 5/2006 | |
| WO | 2006086014 A2 | 8/2006 | |
| WO | 2008091242 A2 | 7/2008 | |
| WO | 2008099524 A1 | 8/2008 | |
| WO | 2008145097 A2 | 12/2008 | |
| WO | 2009016846 A1 | 2/2009 | |
| WO | 2009100015 A2 | 8/2009 | |
| WO | 2009100023 A2 | 8/2009 | |
| WO | 2009108752 A2 | 9/2009 | |
| WO | 2009147085 A1 | 12/2009 | |
| WO | 2010028177 A1 | 3/2010 | |
| WO | 2010033127 A1 | 3/2010 | |
| WO | 2010127298 A2 | 11/2010 | |
| WO | 2010129360 A2 | 11/2010 | |
| WO | 2011003871 A1 | 1/2011 | |
| WO | 2011022687 A2 | 2/2011 | |
| WO | 2011035188 A2 | 3/2011 | |
| WO | 2011050336 A2 | 4/2011 | |
| WO | 2011119618 A2 | 9/2011 | |
| WO | 2011140273 A2 | 11/2011 | |
| WO | 2011160130 A2 | 12/2011 | |
| WO | 2012027290 A1 | 3/2012 | |
| WO | 2012088319 A2 | 6/2012 | |
| WO | 2012088338 A2 | 6/2012 | |
| WO | 2012117931 A1 | 9/2012 | |
| WO | 2012122572 A2 | 9/2012 | |
| WO | 2012174752 A1 | 12/2012 | |
| WO | 2013056249 A1 | 4/2013 | |
| WO | 2014110484 A2 | 7/2014 | |
| WO | 2014127376 A2 | 8/2014 | |

OTHER PUBLICATIONS

Younkin et al., "Infrared Absorption by Conical Silicon Microstructures Made in a Variety of Backgroun Gases Using Femtosecon-Laser Pulses", J. Applied Physics, 93, 2626-2629 (Mar. 1, 2003).
Wu, C. et al., "Black Silicon a New Light Absorber," APS Centennial Meeting (Mar. 23, 1999).
Wu et al. "Visible Luminescence From Silicon Surfaces Microstructured in Air", Appl. Phys. Lett., 81, 1999-2001 (Sep. 2002).
Carey et al., "High Sensitivity Silicon-Based VIS/NIR Photodetectors", Optical Society of America (2003) 1-2.
Solar Energy Research Institute, "Basic Photovoltaic Principles and Methods,"Van Nostrand Reinhold Co., NY 1984, pp. 45-47 and 138-142.
Crouch et al. "Comparison of Structure and Properties of Femtosecond and Nanosecond Laser-Structured Silicon", Appl. Phys. Lett., 84, pp. 1850-1852 (Mar. 15, 2004).
Wu et al., "Near-Unity Below-Band Gap Absorption by Microstructured Silicon", Applied Physics Lett., vol. 78, No. 13, 1850-1852 (Mar. 26, 2001).
Her et al., "Femtosecond Laser-Induced Formation of Spikes On Silicon", Applied Physics, A 70, 383-385 (Mar. 8, 2000).
Her et al., "Microstructuring of Silicon With Femtosecond Laser Pulses", Appl. Phys. Lett., 73, 1673-1675 (Sep. 21, 1998).
Carey et al., "High Sensitivity Silicon-Based VIS/NIR Photodetectors", CLEO 2004 (San Francisco, CA, 2004) 1-2.
Serpenguzel et al., "Temperature Dependence of Photoluminescence in Non-Crystalline Silicon", Photonics West (SAn Jose, CA 2004) 454-462.
Carey et al., "Femtosecond Laser-Assisted Microstructuring of Silicon for Novel Detector, Sensing and Display Technologies", LEOS 2002 (Glasgow, Scotland, 2002) 97-98.
Younkin et al., "Infrared Absorption by Conical Silicon Microstructures Made in a Variety of Background Gases Using Femtosecond-Laser Pulses", CLEO 2001 (Baltimore, MD 2001) 556-556.
Carey et al., "Femtosecon-Laser-Assisted Microstructuring of Silicon Surfaces", Optics and Photonics News, 14, 32-36 (Feb. 2003).
Younkin, "Surface Studies and Microstructure Fabrication Using Femtosecond Laser Pulses", Ph.D. Thesis, Harvard University, 18 pages Aug. 2001).
Wu, "Femtosecond Laser-Gas-Solid Interactions", Ph.D. Thesis, Harvard University, 135 pages (Aug. 2000.
Sanchez et al., "Dynamics of the Hydrodynamical Growth of Columns on Silicon Exposed to ArF Excimer-Laser Irradiation", Appl. Phys. A, 66, 83-86 (1998).
Sanchez et al., "Whiskerlike Strucutre Growth on Silicon Exposed to ArF Excimer Laser Irradiation", Appl. Phys. Lett., 69 (5), 620-622 (Jul. 1996).
Pedraza et al., "Surface Nanostructuring of Silicon", Appl Phys. A. 77, 277-284 (2003).
Fowlkes et al., "Surface Microstructuring and Long-Range Ordering of Silicon Nanoparticles", Appl. Phys. Lett., 80 (20), 3799-3801 (May 2002).
Dolgaev et al., "Formation of Conical Microstructures Upon Laser Evaporation of Solids", Appl. Phys. A. 73, 177-181 (Jun. 20, 2001).
Pedraza et al., "Silicon Microcolumn Arrays Grown by Nanosecond Pulsed-Excimer Laser Irradiation", Appl. Phys. Lett. 74 (16), 2322-2324 (Apr. 1999).
Hu et al., "Solar Cells from Basic to Advanced Systems," McGraw Hill Book Co., NY 1983, pp. 39.
Zhu et al., "Effect of Polarization on Femtosecond Laser Pulses Structuring Silicon Surface", Applied Surface Science, 252 (2006), pp. 2752-2756 (2006).
Huang et al., "A uniform 290 nm periodic Square Strcuture on ZnO Fabricated by Two-Beam Femtosecond Laser Ablation," Nanotechnolgoy, 8 pp. 1-6 (2007).
International Search Report and Written Opinion for PCT Application No. PCT/US09/35239 dated Apr. 23, 2009, dated May 8, 2009.
Carey, et al., "Fabrication of Micrometer-Sized Conical Field Emitters Using Femto-second Laser-Assisted Etching of Silicon," IEEE, pp. 75-76 (2001).
Carey, et al., "Field emission from Silicon Microstructures Formed by Femtosecond Laser Assisted Etching,"Proc. CLEO 2001 (Baltimore, MD 2001) 555-557.
Crouch et al., "Infrared Absorption by Sulfur-Doped Silicon Formed by Femtosecond Laser Irradiation", Appl. Phys. A. 79, 1635-1641 (Jun. 23, 2004).
Her et al., "Novel Conical Microstructures Created in Silicon With Femtosecond Laser Pulses", CLEO 1998 (San Francisco, CA 1998) 511-512.

(56) References Cited

OTHER PUBLICATIONS

Bouhdata, A. et al., "Modeling of the Spectral Response of PIN Photodetectors Impact of Exposed Zone Thickness, Surface Recombination Velocity and Trap Concentration," Microelectronics Reliability 44 pp. 223-228 (2004).

Vigue, F. and Faurie, J.P., "Zn(MgBe)Se Ultraviolet Photodetectors", Journal of Electronic Materials, vol. 30. No. 6, pp. 662-226 (2001).

Carey, et al., "Femtosecond Laser-Assisted Microstructuring of Silicon for Novel Detector, Sensing and Display Technologies", Electro-Optics Society, IEEE, vol. 1, pp. 481-482 (Oct. 26, 2003).

European Search Report for European Patent Application No. 09015646.4 dated Apr. 15, 2010.

Ong, L. et al. "Framework Architecture for Signaling Transport", Network Working Group, pp. 1-24 (Oct. 1999).

Sidebottom, G. et al., "SS7 MTP3-User Adaptation Layer (M3UA)," Network Working Group, Internet-Draft, pp. 1-128, (Feb. 2001).

Morneault, K. et al., ISDN Q. 921, Network Working Group, pp. 1-66, (Feb. 2001).

Morneault, K. et al., "SS7 MTP2-User Adaptation Layer," Network Working Group, Internet Draft, pp. 1-94, (Feb. 2001).

European Search Report for European Patent Application No. EP 01201953.5 dated Oct. 20, 2001.

Stewart, R. et al., "Stream Control Transmission Protocol," Network Working Group, pp. 1-134. (Oct. 2000).

Bernard, C.G. "Structural and Functional Adaptation in a Visual System", Endeavor, vol. XXVI pp. 79-84 (May 1967).

Clapham, P.B. et al. "Reduction of Lens Reflexion by The "Moth Eye" Principle", Nature vol. 244 pp. 281-282 (Aug. 3, 1973).

Hansen, Henri, et al. "The Black Silicon Method: A Universal Method for Determining the Parameter Setting of a Fluorine-Based Reactive Ion Etcher in Depp Silicon Trench Etching With Profile Control", J. Micromedch. Microeng. pp. 115-120 (1995).

"Masimo Rainbow SET Pulse CO-Oximetry," 2010, Masimo Corporation, Irvine, California, www.masimo.com/Rainbow/about. htm.

A. Arndt, J.F. Allison, J.G. Haynos, and A. Meulenberg, Jr., "Optical Properties of the COMSAT Non-reflective Cell," 11th IEEE Photovoltaic Spec. Conf., p. 40-43, 1975.

Aberle, Progress with polycrystalline silicon thin-film solar cells on glass at UNSW. Journal of Crystal Growth 287,386-390 Jan. 4, 2006.

Agranov, et al., Pixel continues to shrink . . . Small Pixels for Novel CMOS Image Sensors, 4 pages. (No date, but after 2009, cited reference; no publication source).

Amoruso et al., Emission of nanoparticles during ultrashort laser irradiation of silicon targets. Europhysics Letters, vol. 67, No. 3, 404-410, Aug. 1, 2004.

Arango et al., Charge transfer in photovoltaics consisting of interpenetrating networks of conjugated polymer and Ti02 nanoparticles. Applied Physics Letters, vol. 74, No. 12, Mar. 22, 1999, 1698-1700.

Asom et al., Interstitial Defect Reactions in Silicon; Appl. Phys. Lett.; Jul. 27, 1987; pp. 256-258; vol. 51(4); American Institute of Physics.

Beek et al., Efficient hybrid solar cells from zinc oxide nanoparticles and a conjugated polymer. Advanced Materials vol. 16, No. 12, Jun. 2004, 1009-1013.

Bentini et al., Solids & surfaces doping of semiconductors by pulsed-laser irradiation in reactive atmosphere. Applied Physics A: 1988, 45(4):317-324.

Berger, Michael, Moth Eyes Inspire Self-Cleaning Antireflection Nanotechnology Coatings, "Copyright 2008 nanowerk LLC", 3 pages, Nanowerk LLC. (no actual publication date or source).

Berger, O., Inns, D. and Aberle, A.E. "Commercial White Paint as Back Surface Reflector for Thin-Film Solar Cells", Solar Energy Materials & Solar Cells, vol. 91, pp. 1215-1221,May 8, 2007.

Betta et al., Si-PIN X-Ray Detector Technology, Nuclear Instruments and Methods in Physics Research A, 1997, pp. 344-348, vol. A, No. 395, Elsevier Science B.V.

Blood et al., Electrical Characterization of Semiconductors. Reports on Progress in Physics 41, 157-257 (1978).

Boden, S.A. et al., Nanoimprinting for Antireflective Moth-Eye Surfaces, 4 pages, 2008. (No source publication).

Bogue: "From bolometers to beetles: the development of the thermal imaging sensors;" sensor Review; 2007; pp. 278-281; Emerald Group Publishing Limited (ISSN 0260-2288).

Borghesi et al.; "Oxygen Precipitation in Silicon," J. Appl. Phys., v. 77(9), pp. 4169-4244 (May 1, 1995).

Born, M. and E.Wolf, "Princip les of Optics, 7th Ed.", Cambridge University Press, 1999, pp. 246-255.

Brieger,S., O.Dubbers, S.Fricker, A.Manzke, C.Pfahler, A.Plettl, and P.Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, Sep. 15, 2006, doi:10. 1088/0957-4884/17/19/036.

Brus, Luminescence of Silicon Materials—Chains, Sheets, Nanocrystals, Nanowires, Microcrystals, and Porous Silicon. Journal of Physical Chemistry 98,3575-3581 (1994).

Bucksbaum et al., Rapid Melting and Regrowth Velocities in Silicon Heated by Ultraviolet Picosecond Laser-Pulses, Physical Review Letters, vol. 53, No. 2, Jul. 9, 182-185 (1984).

Bulgakov et al., Silicon clusters produced by femtosecond laser ablation: non-thermal emission and gas-phase condensation. Applied Physics A, Materials Science & Processing 79, 1591-1594, Jul. 26, 2004.

Buttgen, B.; "Demodulation Pixel Based on Static Drift Fields"; IEEE Transactions on Electron Devices, vol. 53, No. 11, Nov. 2006.

Campbell et al., Light Trapping Properties of Pyramidally Textured Surfaces. Journal of Applied Physics 62, 243-249, Jul. 1, 1987.

Campbell, Stephen A., "The Science and Engineering of Microeletronic Fabrication, 2nd Ed.", Oxford University Press, 2001, pp. 406-411. (Excerpt from book).

Carey et al., In-situ doping of silicon using the gas immersion laser doping (GILD) process. Applied Surface Science. vol. 43, Issues 1-4, Dec. 2, 1989, pp. 325-332.

Carey, et al. "Fabrication of Micrometer-Sized Conical Field Emitters Using Femtosecond Laser-Assisted Etching of Silicon," Proc. IVMC 2001, 75-76, UC Davis, Davis, CA.

Carey, Femtosecond-laser microstructuring of silicon for novel optoelectronic devices. Thesis. The Division of Engineering and Applied Sciences. Harvard University. Cambridge, MA. Jul. 2004 162 pages.

Carey, P.G. et al., "In-situ Doping of Silicon Using Gas Immersion Laser Doping (GILD) Process," Appl. Surf. Sci. 43, 325-332 (1989).

Chang, S.W., V.P.Chuang, S.T.Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.

Chen, Q. et al., Broadband moth-eye antireflection coatings fabricated by low-cost nanoimprinting, Applied Physics Letters 94, pp. 263118-1-263118-3, Jul. 2, 2009, American Institute of Physics.

Chiang, Wen Jen Et al., "Silicon Nanocrystal-Based Photosensor on Low-Temperature Polycrystalline-Silicone Panels", Applied Physics Letters, Aug. 2, 2007, 51120-1-51120-3, vol. 91, American Inst. Of Physics, Melville, NY.

Chichkov, B.N. et al, "Femtosecond, picosecond and nanosecond laser ablation of solids" Appl. Phys. A 63, 109-115; 1996.

Chien et al, "Pulse Width Effect in Ultrafast Laser Processing of Materials," Applied Physics A, 2005, Published online Aug. 31, 2004, vol. 81, pp. 1257-1263, Springer Berlin, Heidelberg, Germany.

Choubey et al., On Evolution of CMOS Image Sensors, Proceedings of the 8th International Conference on Sensing Technology, Sep. 2-4, 2014, Liverpool, UK, pp. 89-94.

Cifre et al., Polycrystalline Silicon Films Obtained by Hot-Wire Chemical-Vapor-Deposition. Applied Physics 59, 645-651 (1994).

Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.

(56) References Cited

OTHER PUBLICATIONS

CMOSIS, "Global Shutter Image Sensors for Machine Vision Application", Image Sensors Europe 2010, Mar. 23-25, 2010, .Copyrgt. copyright 2010. (Set of view graphs).
Contreras et al., Progress toward 20% efficiency in Cu(In,Ca)Se-2 polycrystalline thin-film solar cells. Progress in Photovoltaics 7, 311-316 (1999).
Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.
Curtins et al., High-Rate Deposition of Amorphous Hydrogenated Silicon-Effect of Plasma Excitation-Frequency. Electronics Letters 23, Issue 5, Feb. 26, 1987.
Delley et al., Quantum Confinement in Si Nanocrystals. Physical Review B, vol. 47, No. 3, Jan. 15, 1397-1400 (1993).
Despeisse, et al., "Thin Film Silicon Solar Cell on Highly Textured Substrates for High Conversion Efficiency", (No publication source, most recent citation is 2010).
Detection of X-ray and Gamma-ray Photons Using Silicon Diodes, Dec. 2000, Detection Technology, Inc., Micropolis, Finland. (No author or publication venue).
Dewan, Rahul et al.; Light Trapping in Thin-Film Silicon Solar Cells with Submicron Surface Texture; Optics Express; vol. 17, No. 25; Dec. 7, 2009; Optical Society of America.
Deych et al., Advances in Computed Tomography and Digital Mammography, Power Point, (Viewgraphs), ISM ART, Nov. 18, 2008, Analogic Corp., Peabody, MA.
Dobie, et al., "Minimization of reflected light in photovoltaic modules", Mar. 1, 2009, www.renewableenergyworld.comireal news/?unintelligible/2009/03/miniaturization-of-reflected-light-in-photovoltaic-modules.
Dobrzanski, L.A. et al., Laser Surface Treatment of Multicrystalline Silicon for Enhancing Optical Properties, Journal of Materials Processing Technology, vol. 201, (2008), Elsevier B.V.,p. 291-296.
Duerinckx, et al.; "Optical Path Length Enhancement for >13% Screenprinted Thin Film Silicon Solar Cells"; 2006.
Dulinski, Wojciech et al., Tests of backside illumincated monolithic CMOS pixel sensor in an HPD set-up, Nuclear Instruments and methods in Physics Research A, Apr. 19, 2005, pp. 274-280, Elsevier B.V.
Fan Ji et al., Advanced Photodiode Detector for Medical CT Imaging: Design and Performance, 2007, pp. 2730-2735, IEEE. A988.
Shah et aL, Thin-film silicon solar cell technology. Progress in Photovoltaics 12, 113-142 (2004).
Sheehy et al., Chalcogen doping of silicon via intense femtosecondlaser irradiation. Materials Science and Engineering B-Solid State Materials for Advanced Technology 137, 289-294 (2007).
Sheehy et al., Role of the Background Gas in the Morphology and Optical Properties of Laser-Microstructured Silicon. Chem Mater. 2005; 17(14):3582-6.
Shockley et al., Detailed Balance Limit ofEfficiency of p-n Junction Solar Cells. Journal of Applied Physic, Mar., vol. 32, No. 3, 510-519 (1961).
Sipe et al., Laser-Induced Periodic Surface-Structure .1. Theory. Physical Review B 27, 1141-1154 (1983).
Slaoui et al., Advanced inorganic materials for photovoltaics. Mrs Bulletin 32, Mar. (2007), 211-218.
Solhusvik, J. et al. "A 1280x960 3.75um pixel CMOS imager with Triple Exposure HDR," Proc. of 2009 International Image Sensor Workshop, Bergen, Norway, Jun. 22-28, 2009.
Staebler et al., Stability of n-i-p. Amorphous-Silicon Solar-Cells. Applied Physics Letters, vol. 3, No. 9, Nov. 1, 1981, 733-735.
Stalmans et al. Porous silicon in crystalline silicon solar cells: A review and the effect on the internal quantum efficiency. Progress in Photovoltaics 6 233-246 ( 1998).
STMicroelctronics, BSI—technical challenges, IISW-2009, Bergen. Jun. 25, 2009, 37 pages.

Stone et al.; The X-ray Sensitivity of Amorphous Selenium for Mammography;.Am. Assoc. Phys. Med.; Mar. 2002; pp. 319-324; vol. 29 No. 3.
Stupca et al., Enhancement of polycrystalline silicon solar cells using ultrathin films of silicon nanoparticle. Applied Physics Letters 91, pp. 063107(1-3), Aug. 6, 2007.
Svrcek et al., Ex situ prepared Si nanocrystals embedded in silica glass: Formation and characterization. Journal of Applied Physics, vol. 95, No. 6, Mar. 15, 2004, 3158-3163.
Svrcek et al., Silicon nanocrystals as light converter for solar cells. Thin Solid Films 451-52, 384-388 (2004).
Szlufcik, J. et al., Simple Integral Screenprinting process for selective emitter polycrystalline silicon solar cells, Applied Physics Letters, vol. 59, No. 13, Sep. 23, 1991, American Institute of Physics, pp. 1583-1584.
Tabbal et al., "Formation of Single Crystal Sulfur Supersaturated Silicon Based Junctions by Pulsed Laser Melting". 2007, J. Vac. Sci. Technol. B25(6), 1847-1852.
Takayanagi, et al., "A 600x600 Pixel, 500, fps CMOS Image Sensor with a 4.4 µm Pinned Photodiode 5-Transistor Global Shutter Pixel", 2007 International Image Sensor Workshop, Jun. 6-10, 2007.
Tiwari et al., A silicon nanocrystals based memory, Applied Physics Letters 68, vol. 86, No. 10, Mar. 4 1996, 1377-1379.
Torres et al., Device grade microcrystalline silicon owing to reduced oxygen contamination, Applied Physics Letters 69, Issue 10, 1373-1375 (1996).
Tournier, et al., Pixel-to-Pixel isolation by Deep Trench technology, STMicroelectronics, 850, rue Jean Monnet—F-38926 Crolles Cedex—France, Jun. 2011, 4 pages.
Tournier, et al., Pixel-to-Pixel isolation by Deep Trench technology: Application to CMOS Image Sensor, https://www.researchgate.net/publication/268300742, 2011, 5 pages.
Tower, John R. et al.; Large Format Backside Illuminated CCD Imager for Space Surveillance; IEEE Transactions on Electron Devices, vol. 50, No. 1; Jan. 2003; pp. 218-224.
Tsing-Hua Her, "Femtochemistry at gas/solid interfaces", The Division of Engin. and Appl. Sciences, Harvard University Cambridge, Massachusetts, May, 1998, pp. 138.
Tull et al., Formation of silicon nanoparticles and web-like aggregates by femtosecond laser ablation in a background gas. Applied Physics A, Materials Science & Prcessing 83, Mar. 1, 2006, 341-346.
Tull et al., Silicon surface morphologies after femtosecond laser irradiation, MRS Bulletin 31, 626-633 (2006).
Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface—Trap Charge Pumping," IEICE Electronics Express, Dec. 26, 2004, vol. 1, No. 18, 556-561.
van der Zel, L. "SF6 and the Environment," EPRI, Nov. 2003.
Wilson et al., Quantum Confinement in Size-Selected, Surface-Oxidized Silicon Nanocrystals. Science 262, Nov. 19, 1993, 1242-1244.
Wilson, "Depth Distributions of Sulfur Implanted Into Silicon as a Function of Ion energy, Ion Fluence, and Anneal Temperature," Journal Applied Physics, 55(10), May 15, 1984, pp. 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Wronski, Electronic Properties of Amorphous Silicon in Solar-Cell Operation, IEEE Transactions on Electron Devices 24, vol. 24, No. 4, Apr. 1977, 351-357.
Wu et al., "13.9%—efficient CdTe polycrystalline thin-film solar cells with an infrared transmission of ~50%", Progress in Photovoltaics 14, 471-483 (2006).
Xiong, Y., et al, "Depth from focusing and defocusing", Computer Vision and Pattern Recognition, 1993. Proceedings CVPR '93., 1993 IEEE, Los Alamitos, CA, USA.IEEE Comput. Soc, Jun. 15, 1993 (Jun. 15, 1993), pp. 68-73.
Xu, Y., et al, "Infrared Detection Using Thermally Isolated Diode," Sensors and Actuators A, Elsevier Sequoia S.A., 1993, vol. 36, 209-217, Lausanne, Switzerland.

(56) References Cited

OTHER PUBLICATIONS

Yablonovitch, et al.; "Intensity Enhancement in Textured Optical Sheets for Solar Cells"; .Copyrgt. 1982 IEEE.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B., et al., Light Trapping Effect from Randomized Textures of Ag/ZnO Back Reflector on Hyrdrogenated Amorphous and Nanocrystalline Silicon Based Solar Cells, Thin Film Solar Technology II, proceedings of SPIE, vol. 7771, 2010, SPIE, pp. 777102(1-7).
Yasutomi, et al.; "Two-Stage Charge Transfer Pixel Using Pinned Diodes for Low-Noise Global Shutter Imaging"; 2009 International Image Sensor Workshop; Mar. 28, 2009.
Yaung et al., "High performance 300mm backside illumination technology for continuous pixel shrinkage," IEEE, 2011 International Electron Devices Meeting, Washington, DC, 2011, pp. 8.2.1-8.2.4., or pp. IEDMII-(175-178).
Yu et al., Polymer Photovoltaic CellsEnhanced Efficiencies Via a Network ofInternal Donor-Acceptor Heterojunctions. Science 270, 1789-1791, Dec. 15, 1995.
Yuan, et al., "Efficient black silicon solar cell with a density-graded nanoporous surface: Optical properties, performance limitations, and design rules", American Institute of Physics, Applied Physics Letters, vol. 95.,1230501 (2009) 3 pages.
Zaidi, S.H. et al.; Diffraction Grating Structures in Solar Cells; Photovoltaic Specialists Conference, 2000; 4 pages; Sep. 2000; IEEE.
Zhang et al, "Ultra-Shallow P+-Junction Formation in Silicon by Excimer Laser Doping: a Heat and Mass Transfer Perspective,"Int. J. Heat Mass Transfer, 1996, 3835-3844, vol. 39, No. 18, Elsevier Science Ltd., Great Britain.
Zhao et al., 19.8% efficient "honeycomb" textured multicrystalline and 24.4% monocrystalline silicon solar cells. Applied Physics Letters, vol. 73, No. 14, Oct. 5, 1998, pp. 1991-1993.
Zhong, S. et al. "All-Solution-Processed Random Si Nanopyramids for Excellent Light Trapping in Ultrathin Solar Sells," AFM-Journal, May 2016 pp. 1-11.
Zhu et al., "Evolution of Silicon Surface Microstructures by Picosecond and Femtosecond Laser Irradiations," Applied Surface Science, 2005, 102-108, Elsevie, Amsterdam, NL, Available online Nov. 2004.
Ziou et al., "Depth from defocus using the hermite transform", Image Processing, 1998. ICIP 98.,IEEE, Intl. Conference on Chicago, IL. Oct. 1998 pp. 958-962.
Lin, A. et al.; Optimization of Random Diffraction Gratings in Thin-Film Solar Cells Using Genetic Algorithms; 2007; 1 page; SSEL Annual Report.
Low Dose Technologies; Power Point.
Luque et al., Increasing the efficiency of ideal solar cells by photon induced transitions at intermediate levels. Physical Review Letters,vol. 78, No. 26, 5014-5017 (Jun. 30, 1997).
Madzharov, et al.; "Light trapping in thin-firm silicon solar cells for superstrate and substrate configuration" Abstract #1614, 218.sup.th ECSs Meeting .Copyrgt. 2010 the Electrochemical Society.
Marti et al., Limiting efficiencies for photovoltaic energy conversion in multigap systems. Solar Energy Materials and Solar Cells 43, 203-222 (1996).
Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.
Matsuno, Shigeru et al.; Advanced Technologies for High Efficiency Photovoltaic Systems; Mitsubishi Electric Advance; vol. 122; pp. 17-19; Jun. 2008.
Meier et al., Complete Microcrystalline p-i-n SolarCell—Crystalline or Amorphous Cell Behavior. Applied Physics Letters, vol. 65, No. 7, 860-862 (Aug. 15, 1994).
Meier et al., Recent progress in micromorph solar cells. Journal of Non-Crystalline Solids, vol. 227-230, 1250-1256 (1998).

Meynants, et al., "Backside illuminated global shutter COMOS image sensors", 2011 International Image Sensor Workshop, Jun. 11, 2011, 4 pages.
Minoglou et al., "Reduction of Electrical Crosstalk in Hybrid Backside Illuminated CMOS Imagers using Deep Trench Isolation," 2008 International Interconnect Technology Conference, Burlingame, CA, USA, 2008, pp. 129-131.
Mo et al., Sulfur point defects in crystalline and amorphous silicon. Physical Review B 70, pp. 205210 (1-10), (Nov. 19, 2004).
Moloney, A.M. et al.; Novel Black Silicon PIN Photodiodes; 8 pages; Jan. 25, 2006; SPIE.
Moon et al. Selective emitter using porous silicon for crystalline silicon solar cells. Solar Energy Materials & Solar Cells, v. 93, pp. 846-850, Nov. 17, 2008.
Moses; Nuclear Medical Imaging—Techniques and Challenges; Power Point; Feb. 9, 2005; Lawrence Berkeley National Laboratory Department of Functional Imaging.
Munck, Generic building blocks for 3D integration and their application on hybrid CMOS image sensors, Katholieke Universiteit Leuven, Kapeldreef 75 B-3001 Heverlee, Sep. 2008, 331 pages.
Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.
Murkin, JM and Arangol, M, "Near Infrared spectroscopy as an index of rain and tissue oxygenation," Bri. J. of Anathesia (BJA/PGA Supplement), Oxford Journal of Medicine & EJA, vol. 103, issue supplement 1, p. i3-i13, (2009).
Myers et al., Enhancing near-infrared avalanche photodiode performance by femtosecond laser microstructuring. Applied Optics, vol. 45, No. 35, 8825-8831 (Dec. 10, 2006).
Nauka et al., "New Intrinsic Gettering Process in Silicon Based on Interactions of Silicon Interstitials," J. App. Phys., vol. 60(2), pp. 615-621, Jul. 15, 1986.
Nauka et al., Intrinsic Gettering in Oxygen-Free Silicon, App. Phys. Lett., vol. 46(7), Apr. 1, 1985, pp. 673-675.
Nayak et al, "Semiconductor Laesr Crystallization of a-Si:H," SPIE Digital Library, 2003, pp. 377-380, vol. 4977, Bellingham, Washington. 2003.
Nayak et al, "Semiconductor Laser Crystallization of a-Si:H on Conducting Tin-Oxide-Coated Glass for Solar Cell and Display Applications," Applied Physics A, 2005, 1077-1080, vol. 80, Springer Berlin, Heidelberg, Germany.
Nayak et al, "Ultrafast-Laser-Assisted Chemical Restructuring of Silicon and Germanium Surfaces," Applied Surface Science, Published online Jan. 30, 2007, 6580-6583, vol. 253, Issue 15, Elsevier B.V.
Nayak et al.; "Femtosecond Laser-Induced Micro-Structuring of Thin a-Si:H Films", Material Research Society Symposium proceeedings; vol. 850; Nov. 28-Dec. 2, 2004; pp. MM1.8.1-MM 1.8.5.
Nayak, B.K. et al.; Ultrafast Laser Textured Silicon Solar Cells; Mater. Res. Soc. Symp. Proc.; vol. 1123; 6 pages; 2009; Materials Research Society.
Nayak, et al., "Efficient light trapping in silicon solar cells by ultrafast-laser-induced self-assembled micro/nano structures", Progress in Photovoltaics: Research and Applications, 2011, 9 pages.
Nirmal et al., Lwninescence photophysics in semiconductor nanocrystals. Accounts of Chemical Research 32. 407-414 (Published on web Nov. 25, 1998).
O'Regan et al., A Low-Cost, High-Efficiency Solar-Cell Based on DyeSensitized Colloidal TiO2 Films. Nature 353, 737-740 (Oct. 24, 1991).
Oden, et al., "Optical and Infrared Detection Using Microcantilevers," SPIE Digital Library downloaded on Oct. 13, 2010, vol. 2744, 10 pp. 345-354.
Ohring, Milton."The Materials of Science of Thin Films", Excerpt, "4.6 CVD Processes and Systems", pp. 176-179, Academic Press, 1992.
Pain, Bedabrata, "A Back-Illuminated Megapixel CMOS Image Sensor", hdl.handle.net/2014/39312, May 1, 2005, 4 pages.
Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.

(56) References Cited

OTHER PUBLICATIONS

Palm et al. CIGSSe Thin Film PB Modules: From Fundamental Investigators to Advanced Performance and Stability; Thin Solid Films; 2004; pp. 544-551; vol. 451-2.
Park et al., "Deep Trench Isolation for Crosstalk Suppression in Active Pixel Sensors with 1.7µm Pixel Pitch", in Japanese Journal of Applied Physics, vol. 46, No. 4B, pp. 2454-5457, Apr. 24, 2007.
Pavesi, Optical gain in silicon nanocrystals. Nature 408, 440-444 (Nov. 23, 2000).
Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.
Rao, et al., Monolithic and Fully-Hybrid Backside Illuminated CMOS Imagers for Smart Sensing, IMEC, Kapeldreef 75, B-3001 Leuven, Belgium, 4 pages.
Rashkeev et al., "Hydrogen passivation and Activation of Oxygen Complexes in Silicon," Applied Physics letters, American Institute of Physics, vol. 78(11), pp. 1571-1573 (Mar. 12, 2001).
Rath et al., Limited influence of grain boundary defects in hot-wire CVD polysilicon films on solar cell performance. Journal of Non-Crystalline Solids, vol. 227-230, 1277-1281 (1998).
Reber et al., Crystalline silicon thin-film solar cellsrecent results at Fraunhofer ISE, Solar Energy 77, 865-875 (Oct. 14, 2004).
Russell, et al., "Nanosecond Eximer Laser Processing for Novel Microelectronic Fabrication", Nanosecond Excimer Laser Processing, 6 pages, 1989, pp. 228-233.
Russell, Ramirez, Kelley, "Nanosecond Excimer Laser Processing for Novel Microelectronic Fabrication," SSC Pacific Technical Reports , pp. 228-233, 2003, vol. 4, US Navy.
Sai, H. et al., Enhancement of Light Trapping in Thin-Film Hydrogenated Microcrystalline Si Solar Cells Using Back Reflectors with Self-Ordered Dimple Pattern, Applied Physics Letters, vol. 93, 2008, American Institute of Physics, Published online Oct. 8, 2008, pp. 143501- to 143501-3.
Sarnet et al., "Femtosecond laser for black silicon and photovoltaic cells", Feb. 21, 2008, Proc. Of SPIE, vol. 6881, pp. 688119(1-15).
Sarnet et al., Laser doping for microelectronics and microtechnology. Proc.of SPIE,Bellingham, WA 2004, vol. 5448 pp. 669-680.
Schaffer et al., Micromachining bulk glass by use of femtosecond laser pulses with nanojoule energy. Optics Letters, vol. 26, No. 2, 93-95, (Jan. 15, 2001).
Schuppler et al., Size, Shape, and Composition of Luminescent Species in Oxidized Si Nanocrystals and H-Passivated Porous Si. Physical Review B 52, 4910-4925 (1995).
Senoussaoui, N. et al., Thin-Film Solar Cells with Periodic Grating Coupler, Thin Solid Films, pp. 397-401, 2004, Elsevier B.V.
Seto, Electrical Properties of Polyclystalline Silicon Films. Jomnal of Applied Physics,vol. 46, No. 12, Dec., 5247-5254 (1975).
Bonse et al. "Femtosecond laser ablation of silicon-modifiation thresholds and morphology," Appl. Phys A. 74, 19-25, (Jan. 2002, published online Jun. 2001).
Carey et al., Visible and near-infared responsivity of femtosecondlaser microstrnctured silicon photodiodes. Opt. Lett. 2005, 30, 15 pages.
Cuadra et al., Present status of intermediate band solar cell research. Thin Solid Films 451-52, 593-599 (2004).
International Search Report and Written Opinion, PCT/US2009/032856, dated Jul. 27, 2009, 7 pages.
International Search Report and Written Opinion, PCT/US2009/032871, dated Sep. 14, 2009, 7 pages.
Shen et al., "Femtosecond laser-induced formation of submicrometer spikes on silicon in water", Appllied Physics Letter, vol. 85(23 ), p. 5694-5696, (2004).
Stocks et al., Texturing of polycrystalline silicon. Solar Energy Materials and Solar Cells 40, 33-42 (1996).
Fontaine, A Review of the 1.4 µm Pixel Generation, Technology Analysis Group Chipworks Inc., 2011, 4 pages.
Fontaine, Ray, A Survey of Enabling Technologies in Successful Consumer Digital Imaging Products (Part 3: Pixel Isolation Structures), http://www.techinsights.com,Jul. 24, 2017, 13 pages.

Forbes, L. and M.Y. Louie, "Backside Nanoscale Texturing to Improve IR Response of Silicon Photodetectors and Solar Cells," Nanotech, vol. 2, pp. 9-12, Jun. 2010.
Forbes; "Texturing, reflectivity, diffuse scattering and light trapping in silicon solar cells"; 2012.
Gibbons, J., "Ion Implantation in Semiconductors—Part II, Damage Production and Annealing", proceedings of the IEEE vol. 60, No. 9 pp. 1062-1096, Sep. 1972.
Gjessing, J. et al., 2D back-side diffraction grating for impored light trapping in thin silicon solar cells, Optics Express, vol. 18, No. 6, pp. 5481-5495, Mar. 15, 2010, Optical Society of America Solar.
Gjessing, J. et al.; 2D blazed grating for light trapping in thin silicon solar cells; 3 pages; 2010; Optical Society of America.
Glezer et al., Ultrafast-laser driven micro-explosions in transparent materials. Applied Physics Letters 71, 882-884 (Aug. 18, 1997).
Gloeckler et al. Band-Gap Grading in Cu(In,Ga)Se2 Solar Cells, Journal of Physics and Chemistry of Solids, 2005, pp. 1891-1894, vol. 66.
Glover et al., Probing paiticle synthesis during femtosecond laser ablation: initial phase transition kinetics. Applied Physics B Lasers and Optics 78, 995-1000 (Apr. 7, 2004).
Glover, Hydrodynamics of particle formation following femtosecond laser ablation. Journal of the Optical Society of America B—Optical Physics, vol. 20, No. 1, Jan., 125-131 (2003).
Goetzberger et al. Chapter 6, High Efficiency Solar Cells. New York: John Wiley& Sons Ltd, 1994.
Goetzberger, et al., Solar Energy Materials & Solar Cells, vol. 92, Aug. 29, 2008 pp. 1570-1578.
Green, Recent developments in photovoltaics. Solar Energy 76, 3-8 (2004).
Greenham et al.,Charge sepai•ation and transport in conjugatedpolymerjsemiconductor-nanocrystal composites studied by photoluminescence quenching and photoconductivity. Physical Review B, vol. 54, No. 24, Dec. 15, 17628-17637 (1996).
Halls et al., Efficient Photodiodes from Interpenetrating Polymer Networks. Nature 376, 498-500 (Aug. 1995).
Han et al., "Evaluation of a Small Negative Transfer Gate Bias on the Performance of 4T CMOS Image Sensor Pixels," 2007 International Image Sensor Workshop, 238-240, Ogunquit, Maine.
Haug, et al.; "Light Trapping effects in thin film silicon solar cells"; 2009.
Heisterkamp et al., Pulse energy dependence of subcellular dissection by femtosecond laser pulses. Optics Express, vol. 13, No. 10, 3690-3696 (May 16, 2005).
Henry, Limiting Efficiencies of Ideal Single and Multiple Energy Gap Terrestrial Solar-Cells. Journal of Applied Physics, vol. 51 (8), 4494-4500 (Aug. 1980).
Hermann, S. et al., Impact of Surface Topography and Laser Pulse Duration for Laser Ablation of Solar Cell Front Bide Passivating SiNx Layers, Journal of Applied Physics, vol. 108, No. 11, pp. 114514-1-114514-8, Dec. 13, 2010, American Institute of Physics.
High-Performance Technologies for Advanced Biomedical Applications, .Copyrgt. 2004 Brochure, pp. 1-46, PerkinElmerOptoelectronics. (Optoelectronics.PerkinElmer.com).
Holland; Fabrication of Detectors and Transistors on High-Resistivity Silicon; Nuclear Instruments and Methods in Physics Research, vol. A275, pp. 537-541 (1989).
Hong et al., Cryogenic processed metal-semiconductor-metal (MSM) photodetectors on MBE grown ZnSe, Jun. 1999, IEEE Transactions on Electron Devices, vol. 46, No. 6, pp. 1127-1134.
Hsieh et al., "Focal-Plane-Arrays and CMOS Readout Techniques of Infrared Imaging Systems," IEE Transactions on Circuits and Systems for Video Technology, 1997, vol. 7, No. 4, Aug. 1997, 594-605.
http://electroiq.com/insights-from-leading-edge/2016/09/iftle-303-sony-introduces-ziptronix-dbi-technology-in-samsung-galaxy-s7, "Omnivision was the first to sample BSI in 2007 but costs were too high and adoption was thus very low", (2016).
http://joseph-tang.blogspot.com/2017/, Oshiyama et al. , Near-infrared Sensitivity Enhancement of a Back-illuminated Complementary Metal Oxide Semiconductor Image Sensor with a Pyramid Surface for Diffraction Structure,(2017).

(56) References Cited

OTHER PUBLICATIONS

Huang, et al. "Key Technique for texturing a uniform pyramid structure with a layer of silicon nitride on monocrystalline silicon wafer" Applied Surface Science, vol. 266, 2013 pp. 245-249.

Huang, et al., "Microstructured silicon photodetector", Applied Physics Letters 89, 033506, 2006 American Institute of Physics, 2006, Jul. 20, pp. 033506 (1-3).

Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.

Imec, 3D Integrated Image Sensors for Smart Imaging Systems, Piet de Moor, 2010, 32 pages.

Ingalson et al. Defect States in the CIGS Solar cells by Photocapacitance and Deep Level Optical Spectroscopy, Bulletin of the Polish Academy of Sciences Technical Sciences, 2005, pp. 157-161, vol. 53(2).

Itonaga et al., "Extremely-low-noise CMOS Image Sensor with high saturation capacity", IEEE, 2011 International Electron Devices Meeting, Washington, DC, 2011, pp. 8.1.1-8.1.4.

Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).

Joy, T. et al.; Development of a Production-Ready, Back-Illuminated CMOS Image Sensor with Small Pixels; Electron Devices Meeting; pp. 1007-1010; 2007; IEEE.

Keppner et al., Passivation Properties of Amorphous and Microcrystalline Silicon Layers Deposited by VHF-GD for Crystalline Silicon Solar-Cells. Solar Energy Materials and Solar Cells 34, 201-209 (1994).

Kim et al., "Strong Sub-Band-Gap Infrared Absorption in Silicon Supersaturated with Sulfur", 2006 Appl. Phys. Lett. 88, 241902-1-241902-3, Published online Jun. 12, 2006.

Kitamura et al., "Suppression of crosstalk by using backside deep trench isolation for 1.12μm backside illuminated CMOS image sensor," 2012 International Electron Devices Meeting, San Francisco, CA, 2012, pp. 24.2.1-24.2.4.

Koh et al., "Simple nanostructuring on silicon surfaceby means of focused beam patterning and wet etching", Applied Surface Science, vol. 162-163, 2000 pp. 599-603.

Kolasinski et al., "Laser Assisted and Wet Chemical Etching of Silicon Nanostructures," J. Vac. Sci. Technol., A 24(4), Jul./Aug. 2006, 1474-1479.

Konstantatos et al., "Engineering the Temproal Response of Photoconductive Photodetectors via Selective Introduction of Surface Trap States," Nano Letters, v. 8(5), pp. 1446-1450 (Apr. 2, 2008).

Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).

Korean Intellectual Property Office (KIPO), CMOS Image Sensor, KIPO, 2004, 29 pages.

Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.

Kroning et al., X-ray Imaging Systems for NDT and General Applications, 2002, Fraunhofer Institute for Nondestructive Testing, Saarbrucken and Dresden, Germany, National Seminar of ISNT, Dec. 5-7, 2002.

Krymski, A High Speed 4 Megapixel Digital CMOS Sensor, 2007 International Image Sensor Workshop, Jun. 6-10, 2007, pp. 78-81.

Lee et al., SNR Performance Comparison of 1.4um Pixel : FSI, Light-guide, and BSI, 2011, 3 pages.

Li et al., "Gettering in High Resistive Float Zone Silicon Wafers for Silicon Detector Applications" Transaction on Nuclear Science, vol. 36(1), pp. 290-294 (Feb. 1, 1989).

Li, "Design and Simulation of an Uncooled Double-Cantilever Microbolometer with the Potential for NETD," 2004, Sensors and Actuators A, pp. 351-359, vol. 112, Elsevier B.V.

Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.

\* cited by examiner

1 PULSE

2 PULSES

5 PULSES

10 PULSES

20 PULSES

50 PULSES

100 PULSES

200 PULSES

300 PULSES

400 PULSES

FEMTOSECOND LASER-INDUCED FORMATION OF SUBMICROMETER SPIKES ON A SEMICONDUCTOR SUBSTRATE

The present application is a continuation of U.S. patent application Ser. No. 14/836,609, filed on Aug. 26, 2015, which is a continuation of U.S. patent application Ser. No. 14/073,460, filed on Nov. 6, 2013 (issued as U.S. Pat. No. 9,136,146 on Sep. 15, 2015), which is a continuation of U.S. patent application Ser. No. 13/021,409, filed on Feb. 4, 2011 (issued as U.S. Pat. No. 8,598,051 on Dec. 3, 2013), which is a continuation of U.S. patent application Ser. No. 12/235,086, filed on Sep. 22, 2008 (issued as U.S. Pat. No. 7,884,446 on Feb. 8, 2011), which is a divisional of U.S. patent application Ser. No. 11/196,929, filed on Aug. 4, 2005 (issued as U.S. Pat. No. 7,442,629 on Oct. 28, 2008), which is a continuation-in-part of U.S. patent application Ser. No. 10/950,230, filed on Sep. 24, 2004 (issued as U.S. Pat. No. 7,057,256 on Jun. 6, 2006) and U.S. patent application Ser. No. 10/950,248, filed on Sep. 24, 2004 (issued as U.S. Pat. No. 7,354,792 on Apr. 8, 2008), all of which are herein incorporated by reference in their entirety. The present application is also related to U.S. patent application Ser. No. 10/155,429, filed on May 24, 2002 (issued as U.S. Pat. No. 7,390,689 on Jun. 24, 2008), which is also herein incorporated by reference in its entirety.

RELATED APPLICATIONS

The present application is a continuation-in-part of U.S. patent application Ser. No. 10/950,248 entitled "Manufacture of Silicon-Based Devices Having Disordered Sulfur-Doped Surface Layers," filed on Sep. 24, 2004, and U.S. patent application Ser. No. 10/950,230, entitled "Silicon-Based Visible And Near-Infrared Optoelectric Devices," filed on Sep. 24, 2004, both of which are herein incorporated by reference in their entirety. The present application is also related to U.S. patent application Ser. No. 10/155,429, entitled "Systems and Methods for Light Absorption and Field Emission Using Microstructured Silicon," filed on May 24, 2002, which is also herein incorporated by reference in its entirety.

FEDERALLY SPONSORED RESEARCH

The invention was made with Government Support under contract DE-FC36-01GO11053 awarded by Department of Energy and under grant NSF-PHY-0117795 awarded by National Science foundation and. The Government has certain rights in the invention.

BACKGROUND

The present invention is generally directed to methods for processing semiconductor substrates and the resultant processed substrates, and more particularly to such methods for modifying the topography of a substrate's surface.

A number of techniques are known for generating micrometer-sized structures on silicon surfaces. For example, quasi-ordered arrays of conical spikes can be formed on a silicon surface by irradiating it with high fluence laser pulses by employing, for example, the methods disclosed in the above U.S. patent applications.

There is, however, still a need for enhanced methods that allow generating even smaller structures on semiconductor surfaces, and particularly on silicon surfaces.

SUMMARY

The present invention is directed generally to methods for generating submicron-sized features on a semiconductor surface by irradiating the surface with short laser pulses. The methods allow modulating the sizes of these features by selecting the irradiation wavelength and/or placing a surface portion to be irradiated in contact with a fluid. The invention can provide formation of features that are substantially smaller in size than those generated by previous techniques. The generated features can be, for example, in the form of substantially columnar spikes, each of which extends front a base to a tip, that protrude above the surface. In many embodiments, the average height of the spikes (i.e., the average separation between the base and the tip) can be less than about 1 micron, and the spikes can have an average width—defined, for example, as the average of the largest dimensions of cross-sections of the spikes at half way between the base and the tip—that ranges from about 100 nm to about 500 nm (e.g., in a range of about 100 nm to about 300 nm).

In one aspect, the present invention provides a method of processing a semiconductor substrate that includes placing at least a portion of a surface of the substrate in contact with a fluid, and exposing that portion to one or more short laser pulses so as to modify its topography. The laser pulses can be selected to have pulse widths in a range of about 50 femtoseconds to about a few nanoseconds, and more preferably in a range of about 100 femtoseconds to about 500 femtoseconds.

In a related aspect, the laser pulses are selected to have energies in a range of about 10 microjoules to about 400 microjoules (e.g., 60 microjoules), and fluences a range about 1 $kJ/m^2$ to about 30 $kJ/m^2$, or from about 3 $kJ/m^2$ to about 15 $kJ/m^2$, or from about 3 to about 8 $kJ/m^2$. The central wavelength of the pulses can be selected to be less than about 800 nm, and preferably in a range of about 400 nm to less than about 800 nm. The number of pulses applied to each location of the surface can be, e.g., in a range of about 1 to about 2500.

In many embodiments, utilizing irradiation wavelengths that are less than about 800 nm, e.g., 400 nm, and/or placing the irradiated portion in contact with the liquid (e.g., water) can lead to formation of sub-micron-sized features over the substrate's surface.

In further aspects, in the above method, the fluid can be selected to be any suitable polar or non-polar liquid. Some examples of such liquids include, without limitation, water, alcohol and silicon oil. Further, the semiconductor substrate can be selected to suit a particular application. By way of example, in some embodiments, the substrate can be an undoped or doped silicon wafer (e.g., an n-doped silicon wafer).

In another aspect, the invention provides a semiconductor substrate that includes a surface layer having at least a portion that exhibits an undulating topography characterized by a plurality of submicron-sized features having an average height less than about 1 micrometer and an average width in a range of about 100 nm to about 500 nm, and preferably in a range of about 100 nm to about 300 nm. The substrate can be any suitable semiconductor substrate, e.g., silicon.

In related aspects, the surface layer has a thickness in a range of about 100 nm to about 1 micrometer and the submicron-sized features comprise spikes each of which extends from a base to tip separated front the base by a distance that is less than about 1 micron. For example, the spikes can protrude above the semiconductor surface by a distance in a range of about 100 nm to about 300 nm.

In another aspect, a method of processing a silicon substrate is disclosed that includes irradiating a portion of a semiconductor surface with one or more femtosecond laser pulses having a center wavelength in a range of about 400 nm to less than about 800 nm so as to generate a plurality of submicron-sized spikes within an upper layer of that surface. The spikes can have an average height less than about 1 micrometer and an average width in a range of about 100 nm to about 500 nm.

In a related aspect, in the above method, the irradiation of the surface portion is performed while that portion is in contact with a fluid. By way of example, the fluid can include a polar or non-polar liquid, or a gas, e.g., one having an electron-donating constituent.

In a related aspect, the above method further calls for disposing a solid substance having an electron-donating constituent on the surface portion that is in contact with the fluid prior to its irradiation by the laser pulses. For example, sulfur powder can be applied to the surface followed by disposing a layer of fluid (e.g., having a thickness in a range of about 1 mm to about 20 mm) on the surface. Subsequently, the surface can be irradiated by the laser pulses so as to generate the spikes within an upper layer of the surface and also generate sulfur inclusions in that layer.

In another aspect, the fluid that is in contact with the substrate's surface comprises an aqueous solution, e.g., one containing an electron-donating constituent. By way of example, the liquid can comprise sulfuric acid.

In a further aspect, a method of processing a semiconductor substrate is disclosed that includes disposing a solid substance having an electron-donating constituent on at least a portion of a surface of the substrate, and irradiating that surface portion with one or more pulses having pulse widths in a range of about 50 fs to about 500 fs so as to generate a plurality of inclusions containing the electron-donating constituent in a surface layer of the substrate. The electron-donating constituent can be, for example, a sulfur-containing substance.

Further understanding of various aspects of the invention can be obtained by reference to the following detailed description in conjunction with the associated drawings, which are described briefly below.

DETAILED DESCRIPTION

The present invention generally provides semiconductor substrates having surfaces that exhibit submicron-sized structures, and methods for generating such structures. In many embodiments, the submicron-sized structures are generated by irradiating a semiconductor substrate's surface with ultra short laser pulses (e.g., femtosecond pulses) while maintaining the surface in contact with a fluid (e.g., water). Exemplary embodiments of the invention are discussed below.

Figure 1:
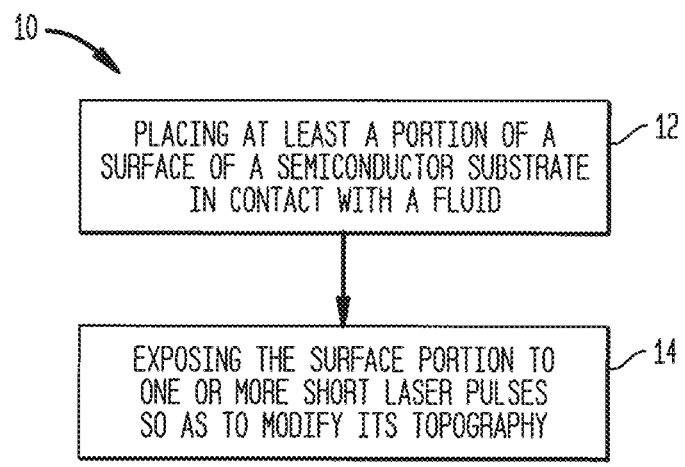
FIG. 1 is a flow chart depicting various steps in one exemplary embodiment of a method according to the teachings of the invention, FIG. 2 schematically depicts a semiconductor substrate on a surface of which a plurality of submicron-sized spikes are formed in accordance with the teachings of the invention.

With reference to a flow chart 10 of FIG. 1, in one exemplar embodiment of a method according to the teachings of the invention for processing a semiconductor substrate, in a step 12, at least a portion of the substrate surface is placed in contact with a fluid, for example, by disposing a layer of the fluid over that portion. In another step 14, the substrate portion that is in contact with the fluid is exposed to one or more short laser pulses so as to modify its surface topography. The laser pulses can have pulse widths in a range of about 100 fs to about a few ns, and more preferably in a range of about 100 fs to about 500 fs. In this exemplary embodiment, the center wavelength of the pulses is chosen to be about 400 nm. More generally, wavelengths in a range of about 400 nm to less than about 800 nm can be employed. The pulse energies can be in a range of about 10 microjoules to about 400 microjoules, and preferably in a range of about 60 microjoules to about 100 microjoules.

Figure 2:
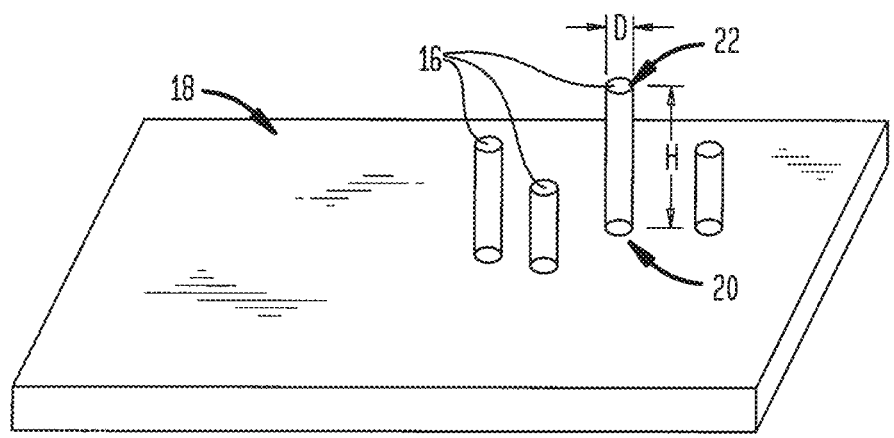

The modification of the surface topography can include generating submicron-sized features in an upper surface layer of the substrate. For example, the submicron-sized features can include a plurality of microstructured spikes, e.g., columnar structures extending from the surface to a height above the surface. FIG. 2 schematically depicts a plurality of such features (also referred to herein a spikes) 16 formed on a semiconductor substrate surface 18. Each spike can be characterized by a height and a width (the spikes are shown only for illustrative purposes and are not intended to indicate actual density, size or shape). For example, a spike 16a has a height H defined as the separation between its base 20 and its tip 22, and a width defined by a diameter D of a cross-section, e.g., one substantially parallel to the substrate surface, at a location half way between the base and the tip. In ease of irregularly shaped spikes, the width can correspond, e.g., to the largest linear dimension of such a cross-section of the spike. In many embodiments, the submicron-sized features exhibit an average height of about 1 micrometer (e.g., a height in a range of about 200 nm to about 1 micrometer) and an average width in a range of about 100 nm to about 500 nm, or in a range of about 100 nm to about 300 nm.

In general, the fluid is selected to be substantially transparent to radiation having wavelength components in a range of about 400 nm to about 800 nm. Further, the thickness of the fluid layer is preferably chosen so as to ensure that it would not interfere with the laser pulses (e.g., via excessive self-focusing of the pulses) in a manner that would inhibit irradiation of the substrate surface. While in this embodiment water is selected as the fluid, in other embodiments other fluids, such as alcohol or silicon oil, can be employed.

In some embodiments, at least a portion of the substrate can be placed in contact with an aqueous solution having an electron-donating constituent. For example, a solution of sulfuric acid can be applied to at least a portion of the substrate followed by irradiating that portion with short pulses (e.g., femtosecond pulses) to not only cause a change in surface topography in a manner described above but also generate sulfur inclusions within a surface layer of the substrate.

Figure 3:
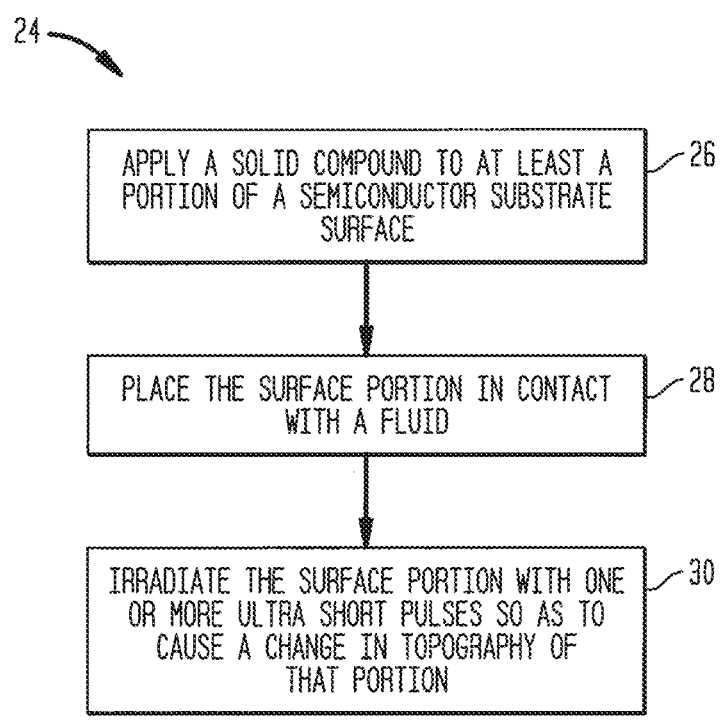
FIG. 3 is a flow chart depicting steps in another exemplary embodiment of a method according to the teachings of the invention for changing topography of a semiconductor surface.

Referring to a flow chart 24 of FIG. 3, in another embodiment, initially a solid compound, e.g., sulfur powder, is applied to at least a portion of a semiconductor substrate surface (e.g., a surface of a silicon wafers) (step 26). Subsequently, in a step 28, that surface portion is placed in contact with a fluid (e.g., water) and is irradiated (step 30) by one or more short laser pulses (e.g., pulses with pulse widths in a range of about 100 fs to about a few ns, and preferably in a range of about 100 fs to about 500 fs) so as to cause a change in topography of that portion. Similar to the previous embodiment, the pulse energies can be chosen to be in a range of about 10 microjoules to about 400 microjoules (e.g., 10-150 microjoules).

Figure 4:
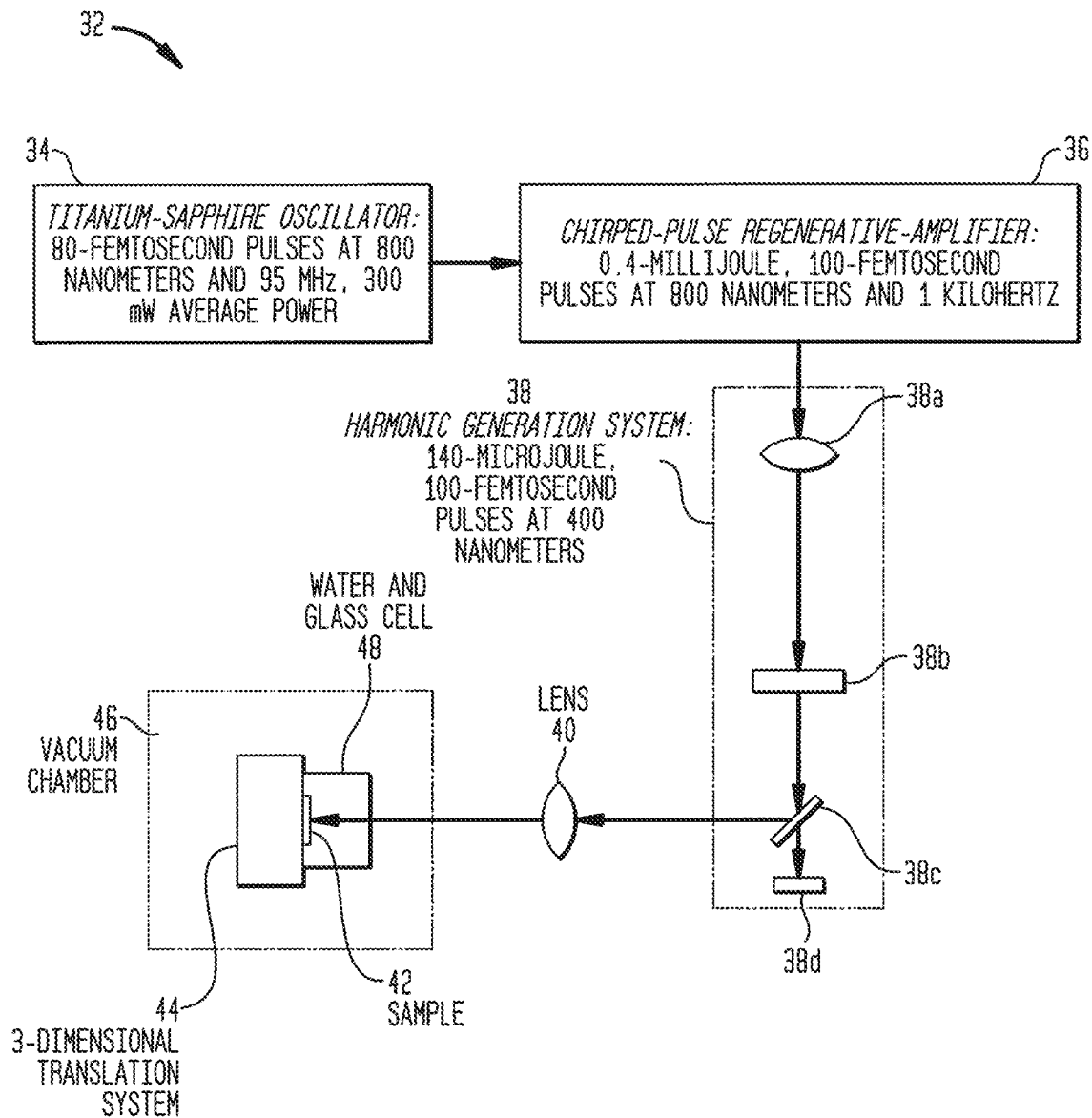
FIG. 4 is a schematic diagram of an exemplary apparatus suitable for use in practicing the processing methods of the invention.

FIG. 4 schematically depicts an exemplary apparatus 32 suitable for performing the above methods of processing a semiconductor substrate. The apparatus 32 includes a Titanium-Saphhire (Ti:Sapphire) laser 34 that generates laser pulses with a pulse width of 80 femtoseconds at 800 nm wavelength having an average power of 300 mW and at a repetition rate of 95 MHz. The pulses generated by the Ti:Sapphire laser are applied to a chirped-pulse regenerative amplifier 36 that, in turn, produces 0.4 millijoule (mJ), 100 femtosecond pulses at a wavelength of 800 nm and at a repetition rate of 1 kilohertz.

The apparatus 32 further includes a harmonic generation system 38 that receives the amplified pulses and doubles their frequency to produce 140-microjoule, 100-femtosecond second-harmonic pulses at a wavelength of 400 nanometers. The harmonic generation system can be of the type commonly utilized in the art. For example, it can include a lens 38a for focusing the incoming pulses into a doubling crystal 38b to cause a portion of the incoming radiation to be converted into second-harmonic pulses. A dichroic mirror 38c can direct the second-harmonic pulses to a lens 40, and a beam stop 38d can absorb the portion of the radiation that remains at the fundamental frequency.

The lens 40 focuses the second-harmonic pulses onto a surface of a sample 42 (e.g., a silicon wafer) disposed on a 3-dimensional translation system 44 within a vacuum chamber 46. A glass liquid cell 48 is coupled to the stage over the sample so as to allow a sample surface to have contact with the fluid (e.g., water) contained within the cell. The three-dimensional stage allows moving the sample relative to the laser pulses for exposing different portions of the surface to radiation. The vacuum chamber can be utilized to pump out air bubbles in the fluid. Alternatively, the processing of the sample can be performed without utilizing a vacuum chamber.

To illustrate the efficacy of the teachings of the invention and only for illustrative purposes, submicrometer-sized silicon spikes were generated in surface layers of silicon wafers submerged in water by irradiating those surfaces with 400-nm, 100-fs laser pulses. For example, a Si (111) wafer was initially cleaned with acetone and rinsed in methanol. The wafer was placed a glass container, such as the container 48 described above, that was filled with distilled water and mounted on a three-axis stage. The silicon surface in contact with the water was irradiated by a 1-KHz train of 100-fs, 60-microjoule pulses at a central wavelength of 400 nm generated by a frequency-doubled, amplified Ti:Sapphire laser, such as that described above. A fast shutter was utilized to control the number of laser pulses incident on the silicon surface. The laser pulses were focused by a 0.25-m focal-length lens to a focal point about 10 mm behind the silicon surface. The pulses traveled through about 10 mm of water before striking the silicon surface at normal incidence. The spatial profile of the laser spot at the sample surface was nearly Gaussian characterized by a fixed beam waist of about of 50 microns. To correct for chirping of the laser pulses in the water and to ensure minimum pulse duration at the silicon surface, the pulses were pre-chirped to obtain the lowest possible damage threshold at that surface. The results, however, did not depend strongly on the chirping of the laser pulses.

During sample irradiation, the irradiated sample surface was monitored with an optical imaging system having a spatial resolution of about 5 microns. It was observed that irradiation cause formation of micrometer-sized water bubbles at the silicon-water interface. After a single pulse, two or three microbubbles were generated; after irradiation with trains of laser pulses thousands of bubbles were generated. It was also observed that some bubbles at times would coalesce to form larger ones, which would adhere to the silicon surface. These larger bubbles were removed by shaking the cell.

Figure 5A:
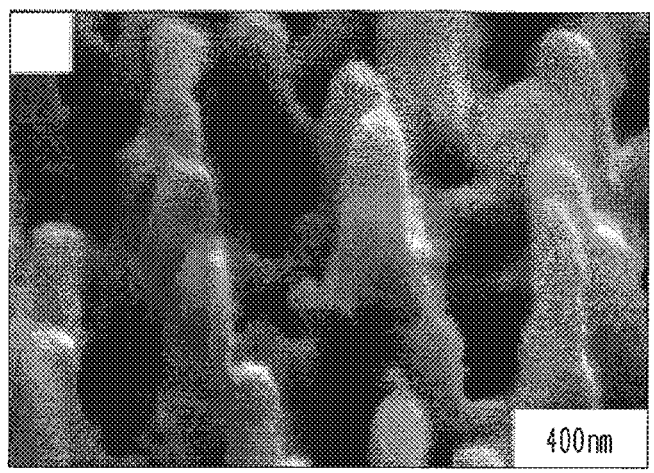
FIGS. 5A and 5B are scanning electron micrographs of silicon spikes formed on a silicon surface viewed at 45° angle relative to a normal to the surface, formed by placing the surface in contact with distilled water and irradiating it with 100-fs, 400-nm, 60-μJ laser pulses.
Figure 5B:
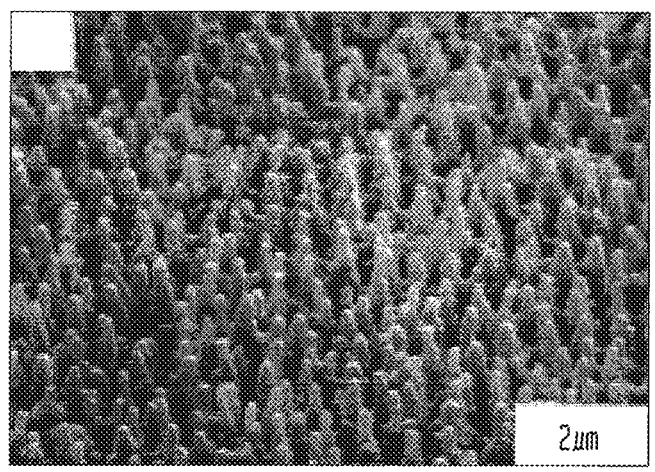
Figure 5C:
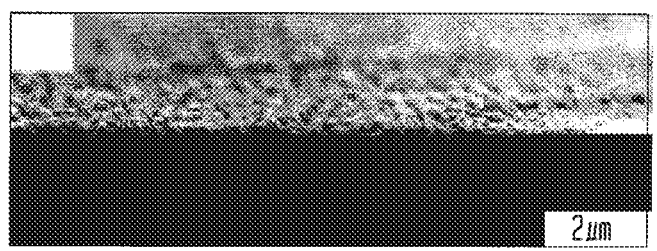
FIG. 5C is a scanning electron micrograph of the spikes shown in FIGS. 5A-5B viewed from the side.

FIGS. 5A, 5B, and 5C present electron micrographs of the silicon surface after irradiation with one thousand laser pulses, showing formation of a plurality of spikes on the surface. The spikes have a substantially columnar shape with a typical height of about 500 nm and a typical diameter of about 200 nm. They protrude up to about 100 nm above the original surface of the wafer (FIG. 1C). The shape of the spikes is more columnar than the conical spikes that can be formed in the presence of $SF_6$, as disclosed in the above-referenced patent applications.

Figure 6A:
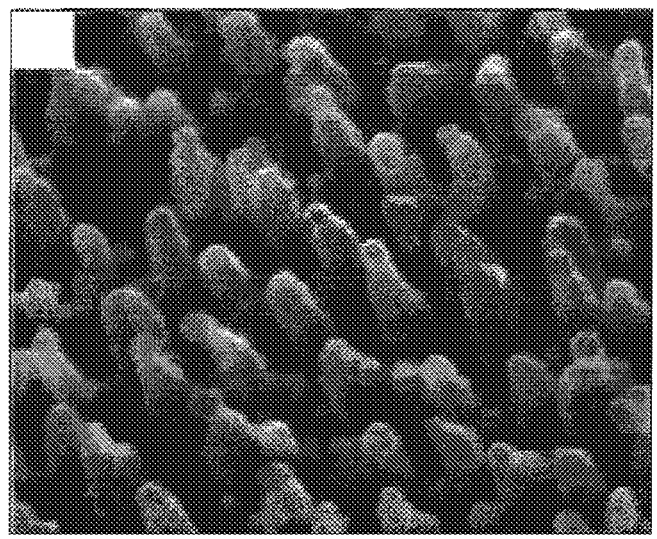
FIG. 6A is another scanning electron micrograph of silicon spikes formed in distilled water by irradiating a silicon surface with femtosecond pulses before etching the surface to remove an upper silicon oxide layer.
Figure 6B:
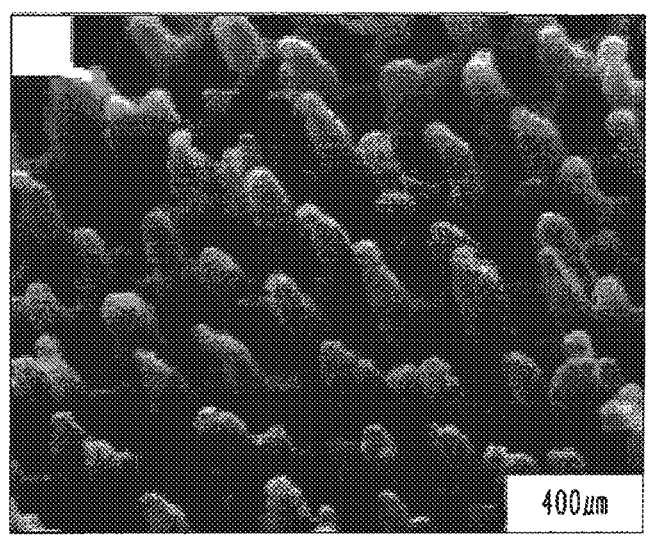
FIG. 6B is a scanning electron micrograph of the silicon spikes of FIG. 6A after having been subjected to etching in HF.

The chemical composition of the uppermost 10 nm of the silicon surface layer having the spikes was determined by employing X-ray photoelectron spectroscopy (XPS). The XPS spectra showed that this layer is composed of about 83% $SiO_2$ and about 17% silicon. The wafer was etched in 4% HF for about 15 minutes to removed the $SiO_2$ layer (about 20 nm in thickness) while leaving the underlying unoxidized Si intact. A comparison of the electron micrographs of the spikes before etching (FIG. 6A) with those obtained after etching (FIG. 6B) showed that the etching process had reduced the width of the spikes by about 40 nm and had rendered their surfaces smoother. After etching, no $SiO_2$ was detected in the X-ray photoelectron spectra of the sample, thereby indicating that the interior of the spikes consisted of silicon and that the spikes were covered prior to etching by an oxide layer that was at most 20 nm thick.

Figure 7A:
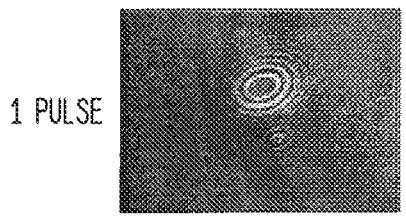
FIGS. 7A-7J are scanning electron micrographs of a silicon surface irradiated while in contact with distilled water by an increasing number of laser pulses (the width of the irradiated area is approximately 50 μm).

To study the development of the spikes, silicon samples were irradiated with different numbers of laser pulses. FIGS. 7A-7J show a series of scanning electron micrographs of the surface of a silicon substrate irradiated with an increasing number of femtosecond laser pulses while in contact with water, in a manner described above. The images only show the central portion of the irradiated area. As shown in FIG. 7A, a single laser pulse forms surface structures resembling ripples on a liquid surface with a wavelength of about 500 nm. Lower magnification micrographs (not shown here) indicate that the irradiated region typically contains two or three of these ripple-like structures. Without being limited to any particular theory, each ripple structure is likely to correspond to one of the microbubbles that were observed after irradiation.

Figure 7B:
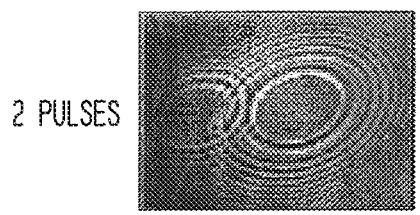
Figure 7C:
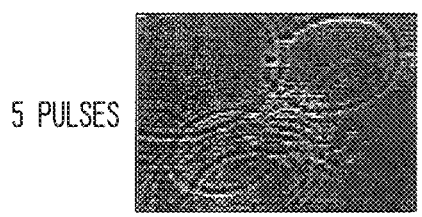
Figure 7D:
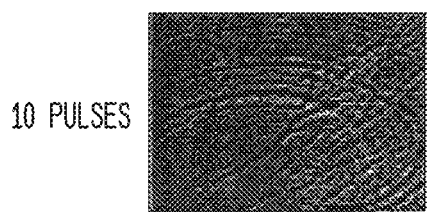
Figure 7E:
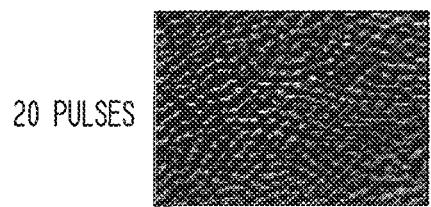
Figure 7F:
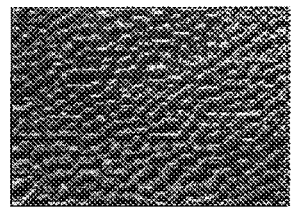
Figure 7G:
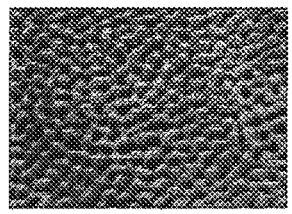
Figure 7H:
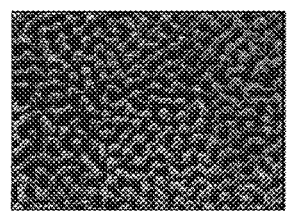
Figure 7I:
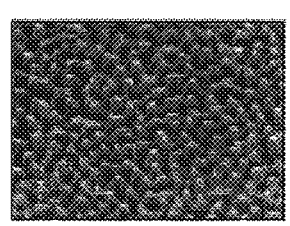
Figure 7J:

Referring to FIG. 7B, after two pulses, the surface shows overlapping ripple structures. As the number of laser pulses is increased from 5 to 20 (FIGS. 7C, 7D and 7E), the silicon surface roughens from the interaction of many ripple structures. After exposure to 50 laser pulses (FIG. 7F), the surface is covered with submicrometer bead-like structures, which then evolve into spikes as the number of pulses is further increased as shown in FIGS. 7G, 7H, 7I and 7J corresponding, respectively, to irradiating the surface with 100, 200, 300 and 400 laser pulses. The average separation of the resulting spikes is roughly 500 nm and substantially equal to the wavelength of the initial ripple structures.

The above silicon spikes prepared in water are one to two orders of magnitude smaller than spikes that can be generated in a silicon substrate exposed to laser pulses in presence of a gas, such as those described in the above-referenced copending patent applications. This remarkable size difference suggests different formation mechanisms for the two types of spikes.

Without being limited to any particular theory, it is noted that when a 400-nm laser pulse interacts with the silicon surface, most of the light is absorbed by a silicon layer tens of nanometers thick near the silicon-water interface. The absolution of intense light in such a thin silicon layer can excite a plasma at the silicon-water interface, which can then equilibrate with the surrounding water and silicon, leaving behind a molten silicon layer on the surface. The molten layer can solidify before the next laser pulse arrives. Due to the high temperature of the plasma, some of the water can vaporize or dissociate, thereby generating bubbles at the silicon-water interface. The large bubbles that were observed after irradiation in the above experiments remain in the water for days, thus suggesting that they consist primarily of gaseous hydrogen and oxygen rather than water vapor.

Again, without being limited to any particular theory, several possible mechanisms can be considered by which the bubbles may produce the wave-like structures shown in FIGS. 7A-7J. Diffraction of the laser beam by the bubbles may produce rings of light intensity on the silicon surface, or the heat of vaporization and dissociation required to form a bubble at the silicon-water interface may cool the silicon surface locally, exciting a capillary wave in the molten silicon through Marangoni flow. The latter is the most likely formation mechanism for the structures observed after a single pulse; those structures cannot be formed by diffraction from a laser-induced bubble, as the pulse duration is only 100 fs, and the observed wave-like structures can be several micrometers in diameter. A micrometer-sized bubble requires much longer than 100 fs to form and therefore cannot diffract the first pulse.

Roughness on the silicon surface can cause an uneven absorption of the laser pulse energy across the surface. The resulting non-uniform temperature of the surface can produce a random arrangement of bubbles. Silicon-water has a contact angle more than 45°, making a gaseous layer between the silicon and water unstable and leading to the formation of bubbles. The vaporization and dissociation of the bubbles can remove thermal energy from the molten silicon surface just below the bubbles, causing the surface to cool rapidly. Because the surface tension of liquid silicon decreases with increasing temperature, the surrounding hot liquid silicon flows toward the cooled region, deforming the surface. This deformation can then excite a circular capillary wave at the liquid-silicon surface. Superposition of ripple-structures caused by multiple laser pulses can then produce the randomly distributed submicrometer beads that appear after 20 laser pulses (See FIGS. 7F-7J). These beads subsequently sharpen into spikes through preferential removal of material around the beads by laser-assisted etching.

As noted above, the morphology and sizes of the above spikes generated in a silicon surface by exposing it to femtosecond laser pulses while in contact with water can be different than those observed for spikes generated by irradiating a silicon surface with femtosecond pulses in presence of a gas, such as $SF_6$. The early stage of submicrometer spike formation in water can be different from that in gaseous $SF_6$, while the later stages can be similar. In $SF_6$, straight submicrometer-sized ripple structures first form on the silicon surface, then coarser, micrometer-scale ridges form on top of (and perpendicular to) the ripples. Next, the coarsened layer breaks up into micrometer-sized beads, and finally the beads evolve into spikes through etching. In both $SF_6$ and water, the length scale of the final structures is set by the arrangement of beadlike structures that form after roughly 10-20 pulses, and this length scale appears to be determined by capillary waves in the molten silicon. The much smaller size of the spikes formed in water is likely to be due to a difference in capillary wavelength in the two cases.

The molten silicon layer is expected to solidify much faster in water than in $SF_6$, the thermal conductivity and heat capacity of liquid water are much greater than those of gaseous $SF_6$. The dispersion relation for capillary waves in a shallow layer of molten silicon indicates that decreasing the lifetime of the molten layer should also decrease the longest allowed capillary wavelength. Using a simple model that neglects the effects of ablation and cooling by heat transfer to the environment to calculate the lifetime and depth of the liquid layer, it was found that the longest allowed capillary wavelength is about 1 micron. Because the lifetime is certainly reduced by the flow of heat to the surrounding water in the experiments presented above, the longest allowed wavelength should be less than 1 micron, which is in agreement with submicrometer spike separation observed here.

In some embodiments, rather than utilizing a fluid, a solid substance having an electron-donating constituent (e.g., a sulfur powder) is disposed on at least a portion of a surface of semiconductor substrate, e.g., a silicon wafer. That surface portion is then irradiated with one or more pulses having pulse widths in a range of about 50 fs to about 500 fs so as to generate a plurality of inclusions containing the electron donating constituent in a surface layer of the substrate.

Those having ordinary skill in the art will appreciate that various changes can be made to the above embodiments without departing from the scope of the invention.

What is claimed is:

1. A substrate, comprising:
   a semiconductor substrate, wherein a surface layer of the semiconductor substrate exhibits a modified topography having a plurality of irregular features having an average height less than about 1 micrometer and an average width in a range of about 100 nm to about 500 nm, each of said irregular features exhibiting an undulating side surface extending from a base to a tip, wherein said plurality of irregular features exhibit an average separation between adjacent features of about 500 nm.

2. The substrate of claim 1, wherein said irregular features have an average width in a range of about 100 nm to about 300 nm.

3. The substrate of claim 1, wherein said plurality of irregular features exhibit an average ratio of height to width in a range from 3 to 10.

4. The substrate of claim 1, wherein said semiconductor substrate comprises a silicon substrate.

5. The substrate of claim 1, wherein said semiconductor substrate comprises an n-doped silicon substrate.

6. The substrate of claim 1, wherein said surface layer has a thickness in a range of about 20 nm to about 1 micrometer.

7. The substrate of claim 1, wherein said irregular features have an average height in a range of about 500 nm to less than about 1 micrometer.

8. The substrate of claim 1, wherein said features protrude above an original surface of the semiconductor substrate by a distance in a range of about 100 nm to about 300 nm.

9. The substrate of claim 1, wherein at least a portion of said plurality of irregular features extend from a base to a tip at a level above an original surface of the semiconductor substrate by a distance in a range of about 100 nm to about 300 nm.

10. A substrate, comprising:
a semiconductor substrate, wherein a surface layer of the semiconductor substrate includes a plurality of protrusions of various heights, the plurality of protrusions characterized by an average width in a range of about 100 nm to about 300 nm and average ratio of height to width in a range of 3 to 10,
wherein said protrusions exhibit an average separation between adjacent protrusions of about 500 nm.

11. The substrate of claim 10, wherein said protrusions exhibit height variations characterized by an average height in a range of about 500 nm to about 1 micrometer.

12. The substrate of claim 10, wherein said protrusions protrude above an original surface of the semiconductor substrate by a distance in a range of about 100 nm to about 300 nm.

13. The substrate of claim 10, wherein said semiconductor substrate comprises a silicon substrate.

14. The substrate of claim 10, wherein said semiconductor substrate comprises an n-doped silicon substrate.

15. The substrate of claim 10, wherein said protrusions are disposed with a surface layer of the substrate having a thickness in a range of about 20 nm to about 1 micrometer.

16. A substrate, comprising:
a semiconductor substrate, wherein a surface layer of the semiconductor substrate includes a plurality of protrusions of various heights, each of the plurality of protrusions characterized by an undulating side surface extending from a base to a tip, said plurality of protrusions having an average height less than about 1 micrometer, wherein said protrusions have a width in a range of about 100 nm to about 500 nm.

17. The substrate of claim 16, wherein said plurality of protrusions exhibit an average ratio of height to width in a range of 3 to 10.

18. The substrate of claim 16, wherein said plurality of protrusions exhibit an average separation between adjacent protrusions of about 500 nm.

* * * * *